US008632952B2

(12) United States Patent
Suzumura et al.

(10) Patent No.: US 8,632,952 B2
(45) Date of Patent: Jan. 21, 2014

(54) PHOTOSENSITIVE RESIN COMPOSITION, PHOTOSENSITIVE RESIN CURED MATTER, PHOTOSENSITIVE RESIN FILM, PHOTOSENSITIVE RESIN FILM CURED MATTER AND OPTICAL WAVEGUIDE OBTAINED BY USING THE SAME

(75) Inventors: Kouji Suzumura, Ibaraki (JP); Tatsuya Makino, Ibaraki (JP); Atsushi Takahashi, Ibaraki (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 847 days.

(21) Appl. No.: 12/520,898

(22) PCT Filed: Nov. 17, 2008

(86) PCT No.: PCT/JP2008/070874
§ 371 (c)(1),
(2), (4) Date: Jun. 23, 2009

(87) PCT Pub. No.: WO2009/066638
PCT Pub. Date: May 28, 2009

(65) Prior Publication Data
US 2010/0027950 A1    Feb. 4, 2010

(30) Foreign Application Priority Data

Nov. 20, 2007  (JP) ................................ 2007-300428
Dec. 25, 2007  (JP) ................................ 2007-332726

(51) Int. Cl.
*G03C 1/00*      (2006.01)
*G03C 1/053*     (2006.01)
*C08F 2/50*      (2006.01)

(52) U.S. Cl.
USPC .................. 430/286.1; 430/270.1; 430/281.1; 430/287.1; 430/297; 430/311; 430/325; 430/326; 428/411.1; 428/451; 428/473.5; 427/508; 427/510; 427/517; 522/107; 522/113; 522/114; 522/120; 522/121; 522/134; 522/135; 522/144; 522/151; 522/152; 522/153; 522/176; 522/178; 522/182

(58) Field of Classification Search
USPC ............. 430/270.1, 281.1, 286.1, 287.1, 297, 430/311, 325, 326; 428/411.1, 451, 473.5; 427/508, 510, 517; 522/104, 107, 113, 522/114, 120, 121, 134, 135, 144, 151, 152, 522/153, 176, 178, 182
See application file for complete search history.

(56) References Cited

U.S. PATENT DOCUMENTS

| 6,028,123 | A   | * | 2/2000  | Hirayama et al. ............ 522/151 |
| 6,048,660 | A   |   | 4/2000  | Leppard et al. |
| 7,371,783 | B2  | * | 5/2008  | Tatsuzawa et al. ............ 522/176 |
| 7,747,129 | B2  | * | 6/2010  | Makino et al. ................ 385/141 |
| 2004/0235992 | A1 |   | 11/2004 | Okada et al. |
| 2005/0074563 | A1 | * | 4/2005  | Tatsuzawa et al. ............. 428/1.1 |
| 2005/0142318 | A1 | * | 6/2005  | Nakabayashi et al. ....... 428/40.1 |
| 2005/0228062 | A1 |   | 10/2005 | Wolf et al. |
| 2010/0188765 | A1 |   | 7/2010  | Matsumoto et al. |

FOREIGN PATENT DOCUMENTS

| EP | 1818366       | 8/2007  |
| EP | 2045629       | 4/2009  |
| EP | 2112181       | 10/2009 |
| JP | 02-062546     | 3/1990  |
| JP | 2002-020411   | 1/2002  |
| JP | 2003-195079   | 7/2003  |
| JP | 2003-202669   | 7/2003  |
| JP | 2006-063288   | 3/2006  |
| JP | 2007-106955   | 4/2007  |
| JP | 2007106955 A * | 4/2007 |
| JP | 2007-327979   | 12/2007 |
| WO | WO 98/01479   | 1/1998  |
| WO | WO 2006/098424 A1 | 9/2006 |
| WO | WO 2007/074782 A1 | 7/2007 |
| WO | WO 2007/125740 | 11/2007 |
| WO | WO 2008013140 A1 * | 1/2008 |

OTHER PUBLICATIONS

Extended European Search Report dated Mar. 10, 2011, including Supplementary European Search Report and European Search Opinion.
Japanese Official Action dated Sep. 11, 2012, for JP Application No. 2009-170308.

* cited by examiner

*Primary Examiner* — Sanza McClendon
(74) *Attorney, Agent, or Firm* — Antonelli, Terry, Stout & Kraus, LLP.

(57) ABSTRACT

Provided are a photosensitive resin composition which is soluble in an alkaline aqueous solution and which has a good propagation loss in a visible light wavelength region, a photosensitive resin cured matter, a photosensitive resin film, a photosensitive resin film cured matter and an optical waveguide obtained by using the same.
Provided are, to be specific, a photosensitive resin composition comprising (A) a vinyl polymer having at least one chain-polymerizable functional group in a molecule, (B) a polymerizable compound and (C) a polymerization initiator, wherein the component (C) is at least one selected from the group consisting of 2-[2-oxo-2-phenylacetoxyethoxy]ethyl oxyphenylacetate, 2-(2-hydroxyethoxy)ethyl oxyphenylacetate and oligo{2-hyroxy-2-methyl-1-[4-(1-methylvinyl)phenyl]}propanone, a photosensitive resin cured matter, a photosensitive resin film, a photosensitive resin film cured matter and an optical waveguide obtained by using the same.

23 Claims, 1 Drawing Sheet

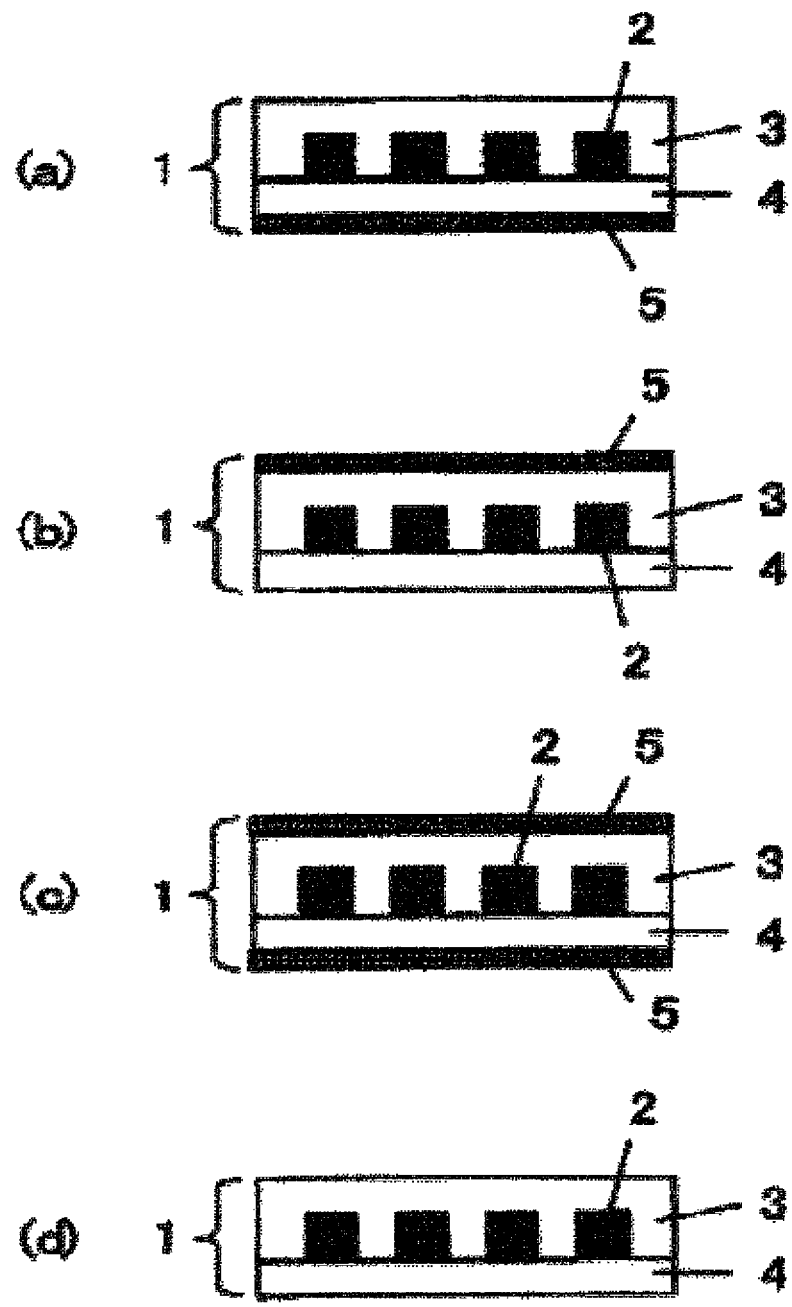

PHOTOSENSITIVE RESIN COMPOSITION, PHOTOSENSITIVE RESIN CURED MATTER, PHOTOSENSITIVE RESIN FILM, PHOTOSENSITIVE RESIN FILM CURED MATTER AND OPTICAL WAVEGUIDE OBTAINED BY USING THE SAME

BACKGROUND OF THE INVENTION

The present invention relates to a photosensitive resin composition and a cured matter thereof, a photosensitive resin film and a cured matter thereof and an optical waveguide obtained by using the same, specifically to a photosensitive resin composition which is excellent in a propagation characteristic in a visible light wavelength region and which is soluble in an alkaline aqueous solution and a cured matter thereof, a photosensitive resin film and a cured matter thereof and an optical waveguide obtained by using the same.

RELATED ART

Light sources for illumination which draw attentions in recent years include white LED. White LED has a high luminance and a low power consumption in combination, and therefore in recent years, it is used in many cases for various mobile equipments such as portable phones, personal digital assistants (PDA), handheld gaming units, portable audio devices and the like.

Also, the above equipments are required to be further reduced in a power consumption and further decreased in a weight, and therefore illumination carried out by using devices such as light guide plate and waveguides as devices for lighting more efficiently attracts attentions.

Among them, devices prepared by using polymers are excellent particularly in a processability and can assume a flexible structure, and therefore polymer optical waveguides and polymer waveguides are most suited to the above uses.

High transparency (low light propagation loss) particularly in a visible light region is required to the above devices for illumination from the viewpoints of use environment of equipments to which the devices are applied and mounting of parts. Materials suited to the above uses include alicyclic polyolefins and vinyl polymers represented by (meth)acryl polymers.

A large part of them has a very high transparency and is used mainly for applications such as prisms, lenses and the like, but uses thereof are centered in injection molding, and therefore involved therein is the problem that they can not be used for members which are small-sized and have complicated forms and very thin members.

A photosensitive resist is considered as a processing technique which makes it possible to mold complicated members. A sheet-shaped resin, a film-shaped resin or a liquid resin which is provided with a photosensitivity is irradiated with light via a pattern mask to thereby three-dimensionally cross-link and insolubilize only an optional part, and then an unexposed part is dissolved and removed by a solvent and the like, whereby a member having a complicated form can readily be formed.

Further, covering the above member with a material having a low refraction index and air makes it possible to more efficiently propagate light. Accordingly, materials which are provided with a photosensitivity and have good optical characteristics are investigated (refer to, for example, patent documents 1 and 2).

In the above materials, a good propagation characteristic is shown in a laser beam of a long wavelength side (for example, 850 nm), but involved therein are the problems that a beam in a 400 to 600 nm region which resides in a visible light region is not yet investigated and that used is a trimethylammonium hydroxide aqueous solution which has a good propagation characteristic at a short wavelength side but is strongly stimulating to human bodies and which exerts a large load on the environment.

Patent document 1: Japanese Patent Application Laid-Open No. 195079/2003
Patent document 2: Japanese Patent Application Laid-Open No. 63288/2003

DISCLOSURE OF THE INVENTION

The present invention has been made in order to solve the problems described above, and an object thereof is to provide a photosensitive resin composition which is soluble in an alkaline aqueous solution and which has a good propagation loss in a visible light region, a photosensitive resin cured matter, a photosensitive resin film, a photosensitive resin film cured matter and an optical waveguide obtained by using the same.

Intensive investigations repeated by the present inventors have resulted in finding that the problems described above can be solved by producing an optical waveguide by using a photosensitive resin composition comprising a vinyl polymer having at least one chain-polymerizable functional group in a molecule, a polymerizable compound and a specific polymerization initiator and a photosensitive resin film comprising the same, and thus they have come to complete the present invention.

That is, the present invention provides:

(1) a photosensitive resin composition comprising (A) a vinyl polymer having at least one chain-polymerizable functional group in a molecule, (B) a polymerizable compound and (C) a polymerization initiator, wherein the component (C) is at least one selected from the group consisting of 2-[2-oxo-2-phenylacetoxyethoxy]ethyl oxyphenylacetate, 2-(2-hydroxyethoxy)ethyl oxyphenylacetate and oligo{2-hyroxy-2-methyl-1-[4-(1-methylvinyl)phenyl]}propanone, (2) a photosensitive resin cured matter obtained by curing or polymerizing the above photosensitive resin composition, (3) a photosensitive resin film comprising a three layer structure of a base film, a resin layer comprising the photosensitive resin composition or the photosensitive resin cured matter each described above and a protective film, (4) a photosensitive resin film cured matter comprising three layer structure of a base film, a resin layer comprising the photosensitive resin composition or the photosensitive resin cured matter each described above and a protective film and (5) an optical waveguide, wherein at least one of a lower cladding layer, a core part and an upper cladding layer is formed by using the photosensitive resin film or the photosensitive resin film cured matter each described above.

According to the present invention, capable of being provided are a photosensitive resin composition having a good propagation characteristic in a visible light region, a photosensitive resin cured matter, a photosensitive resin film, a photosensitive resin film cured matter and an optical waveguide obtained by using the same.

BRIEF EXPLANATION OF THE DRAWINGS

FIG. 1 is a cross-sectional drawing of an optical waveguide, wherein (a) is an optical waveguide in which a protective film is disposed at an outside of a lower cladding layer; (b) is an optical waveguide in which the protective film is disposed at an outside of an upper cladding layer; (c) is an optical waveguide in which the protective films are disposed at the outsides of the lower cladding layer and the upper cladding layer; and (d) is an optical waveguide in which the protective film is not disposed.

| Explanation of Codes | |
|---|---|
| 1 | Optical waveguide |
| 2 | Core part |
| 3 | Upper cladding layer |
| 4 | Lower cladding layer |
| 5 | Protective film (substrate) |

BEST MODE FOR CARRYING OUT THE INVENTION

The best mode for carrying out the invention shall be explained below in details.

The photosensitive resin composition of the present invention comprises (A) a vinyl polymer having at least one chain-polymerizable functional group in a molecule, (B) a polymerizable compound and (C) a polymerization initiator, wherein at least one selected from the group consisting of 2-[2-oxo-2-phenylacetoxyethoxy]ethyl oxyphenylacetate, 2-(2-hydroxyethoxy)ethyl oxyphenylacetate and oligo{2-hydroxy-2-methyl-1-[4-(1-methylvinyl)phenyl]}propanone is used as the component (C). They may be used alone or in combination of two or more kinds thereof. In particular, it is the most preferred embodiment to use 2-[2-oxo-2-phenylacetoxyethoxy]ethyl oxyphenylacetate and 2-(2-hydroxyethoxy)ethyl oxyphenylacetate in a mixture.

Not only a cured matter which is less colored and has a high transparency in a visible light region is obtained by using the above polymerization initiator, but also an optical waveguide prepared by using the above composition is reduced in a material loss in a visible light region, and therefore it is preferred.

A content of the component (C) is 0.5 to 5.0 parts by mass based on total 100 parts by mass of the component (A) and the component (B). If it is less than 0.5 part by mass, the curing reaction does not sufficiently proceed by irradiation with light, and if it exceeds 5.0 parts by mass, an influence of coloration originating in the component (C) is increased. As a result thereof, the transparency is reduced in a visible light region, and a material loss is increased in a waveguide. Accordingly, both are not preferred. Because of the reasons described above, a content of the component (C) is more preferably 1.0 to 3.0 parts by mass.

Next, the component (A) used in the present invention shall be explained. From the viewpoints of the transparency, the heat resistance and the solubility in an alkaline aqueous solution, the component (A) comprises preferably at least one of a repetitive unit (A-1) represented by the following Formula (1) and a repetitive unit (A-2) represented by the following Formula (2) and at least one of a repetitive unit (A-3) represented by the following Formula (3) and a repetitive unit (A-4) represented by the following Formula (4) on a principal chain, and a (meth)acryl polymer having the above repetitive units is particularly preferably used.

[Formula 1]

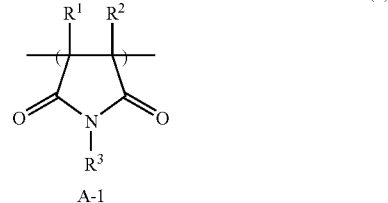

A-1

In Formula (1) described above, $R^1$ to $R^3$ each are independently a hydrogen atom or a monovalent organic group having 1 to 20 carbon atoms.

[Formula 2]

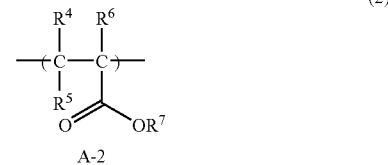

A-2

In Formula (2) described above, $R^4$ to $R^6$ each are independently a hydrogen atom or a monovalent organic group having 1 to 20 carbon atoms. $R^7$ is a monovalent organic group having 1 to 20 carbon atoms.

[Formula 3]

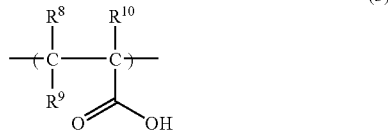

In Formula (3) described above, $R^8$ to $R^{10}$ each are independently a hydrogen atom or a monovalent organic group having 1 to 20 carbon atoms.

[Formula 4]

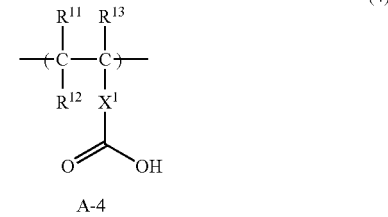

A-4

In Formula (4) described above, $R^{11}$ to $R^{13}$ each are independently a hydrogen atom or a monovalent organic group having 1 to 20 carbon atoms. $X^1$ is a divalent organic group having 1 to 20 carbon atoms.

The organic groups in Formulas (1) to (4) include, for example, monovalent or divalent groups such as an alkyl group, a cycloalkyl group, an aryl group, an aralkyl group, a carbonyl group, an alkoxycarbonyl group, an aryloxycarbonyl group, a carbamoyl group and the like, and they may be substituted with a hydroxyl group, a halogen atom, an alkyl group, a cycloalkyl group, an aryl group, an aralkyl group, a carbonyl group, an alkoxycarbonyl group, an aryloxycarbonyl group, a carbamoyl group, an alkoxy group, an aryloxy group, an alkylthio group, an arylthio group, an amino group, a silyl group and the like.

The structure of the repetitive unit (A-1) shall not specifically be restricted as long as it is represented by Formula (1).

Maleimide which is a raw material of the repetitive unit (A-1) includes, for example, alkylmaleimides such as N-methylmaleimide, N-ethylmaleimide, N-propylmaleimide, N-isopropylmaleimide, N-butylmaleimide, N-isobutylmaleimide, N-2-methyl-propylmaleimide, N-pentylmaleimide, N-2-pentylmaleimide, N-3-pentylmaleimide, N-2-methyl-1-butylmaleimide, N-2-methyl-2-butylmaleimide, N-3-methyl-1-butylmaleimide, N-3-methyl-2-butylmaleimide, N-hexylmaleimide, N-2-hexylmaleimide, N-3-hexylmaleimide, N-2-methyl-1-pentylmaleimide, N-2-methyl-2-pentylmaleimide, N-2-methyl-3-pentylmaleimide, N-3-methyl-1-pentylmaleimide, N-3-methyl-2-pentylmaleimide, N-3-methyl-3-pentylmaleimide, N-4-methyl-1-pentylmaleimide, N-4-methyl-2-pentylmaleimide, N-2,2-dimethyl-1-butylmaleimide, N-3,3-dimethyl-1-butylmaleimide, N-3,3-dimethyl-2-butylmaleimide, N-2,3-dimethyl-1-butylmaleimide, N-2,3-dimethyl-2-butylmaleimide, N-hydroxymethylmaleimide, N-1-hydroxyethylmaleimide, N-2-hydroxyethylmaleimide, N-1-hydroxy-1-propylmaleimide, N-2-hydroxy-1-propylmaleimide, N-3-hydroxy-1-propylmaleimide, N-1-hydroxy-2-propylmaleimide, N-2-hydroxy-2-propylmaleimide, N-1-hydroxy-1-butylmaleimide, N-2-hydroxy-1-butylmaleimide, N-3-hydroxy-1-butylmaleimide, N-4-hydroxy-1-butylmaleimide, N-1-hydroxy-2-butylmaleimide, N-2-hydroxy-2-butylmaleimide, N-3-hydroxy-2-butylmaleimide, N-4-hydroxy-2-butylmaleimide, N-2-methyl-3-hydroxy-1-propylmaleimide, N-2-methyl-3-hydroxy-2-propylmaleimide, N-2-methyl-2-hydroxy-1-propylmaleimide, N-1-hydroxy-1-pentylmaleimide, N-2-hydroxy-1-pentylmaleimide, N-3-hydroxy-1-pentylmaleimide, N-4-hydroxy-1-pentylmaleimide, N-5-hydroxy-1-pentylmaleimide, N-1-hydroxy-2-pentylmaleimide, N-2-hydroxy-2-pentylmaleimide, N-3-hydroxy-2-pentylmaleimide, N-4-hydroxy-2-pentylmaleimide, N-5-hydroxy-2-pentylmaleimide, N-1-hydroxy-3-pentylmaleimide, N-2-hydroxy-3-pentylmaleimide, N-3-hydroxy-3-pentylmaleimide, N-1-hydroxy-2-methyl-1-butylmaleimide, N-1-hydroxy-2-methyl-2-butylmaleimide, N-1-hydroxy-2-methyl-3-butylmaleimide, N-1-hydroxy-2-methyl-4-butylmaleimide, N-2-hydroxy-2-methyl-1-butylmaleimide, N-2-hydroxy-2-methyl-3-butylmaleimide, N-2-hydroxy-2-methyl-4-butylmaleimide, N-2-hydroxy-3-methyl-1-butylmaleimide, N-2-hydroxy-3-methyl-2-butylmaleimide, N-2-hydroxy-3-methyl-3-butylmaleimide, N-2-hydroxy-3-methyl-4-butylmaleimide, N-4-hydroxy-2-methyl-1-butylmaleimide, N-4-hydroxy-2-methyl-2-butylmaleimide, N-1-hydroxy-3-methyl-2-butylmaleimide, N-1-hydroxy-3-methyl-1-butylmaleimide, N-1-hydroxy-2,2-dimethyl-1-propylmaleimide, N-3-hydroxy-2,2-dimethyl-1-propylmaleimide, N-1-hydroxy-1-hexylmaleimide, N-1-hydroxy-2-hexylmaleimide, N-1-hydroxy-3-hexylmaleimide, N-1-hydroxy-4-hexylmaleimide, N-1-hydroxy-5-hexylmaleimide, N-1-hydroxy-6-hexylmaleimide, N-2-hydroxy-1-hexylmaleimide, N-2-hydroxy-2-hexylmaleimide, N-2-hydroxy-3-hexylmaleimide, N-2-hydroxy-4-hexylmaleimide, N-2-hydroxy-5-hexylmaleimide, N-2-hydroxy-6-hexylmaleimide, N-3-hydroxy-1-hexylmaleimide, N-3-hydroxy-2-hexylmaleimide, N-3-hydroxy-3-hexylmaleimide, N-3-hydroxy-4-hexylmaleimide, N-3-hydroxy-5-hexylmaleimide, N-3-hydroxy-6-hexylmaleimide, N-1-hydroxy-2-methyl-1-pentylmaleimide, N-1-hydroxy-2-methyl-2-pentylmaleimide, N-1-hydroxy-2-methyl-3-pentylmaleimide, N-1-hydroxy-2-methyl-4-pentylmaleimide, N-1-hydroxy-2-methyl-5-pentylmaleimide, N-2-hydroxy-2-methyl-1-pentylmaleimide, N-2-hydroxy-2-methyl-2-pentylmaleimide, N-2-hydroxy-2-methyl-3-pentylmaleimide, N-2-hydroxy-2-methyl-4-pentylmaleimide, N-2-hydroxy-2-methyl-5-pentylmaleimide, N-2-hydroxy-3-methyl-1-pentylmaleimide, N-2-hydroxy-3-methyl-2-pentylmaleimide, N-2-hydroxy-3-methyl-3-pentylmaleimide, N-2-hydroxy-3-methyl-4-pentylmaleimide, N-2-hydroxy-3-methyl-5-pentylmaleimide, N-2-hydroxy-4-methyl-1-pentylmaleimide, N-2-hydroxy-4-methyl-2-pentylmaleimide, N-2-hydroxy-4-methyl-3-pentylmaleimide, N-2-hydroxy-4-methyl-4-pentylmaleimide, N-2-hydroxy-4-methyl-5-pentylmaleimide, N-3-hydroxy-2-methyl-1-pentylmaleimide, N-3-hydroxy-2-methyl-2-pentylmaleimide, N-3-hydroxy-2-methyl-3-pentylmaleimide, N-3-hydroxy-2-methyl-4-pentylmaleimide, N-3-hydroxy-2-methyl-5-pentylmaleimide, N-1-hydroxy-4-methyl-1-pentylmaleimide, N-1-hydroxy-4-methyl-2-pentylmaleimide, N-1-hydroxy-4-methyl-3-pentylmaleimide, N-1-hydroxy-4-methyl-4-pentylmaleimide, N-1-hydroxy-3-methyl-1-pentylmaleimide, N-1-hydroxy-3-methyl-2-pentylmaleimide, N-1-hydroxy-3-methyl-3-pentylmaleimide, N-1-hydroxy-3-methyl-4-pentylmaleimide, N-1-hydroxy-3-methyl-5-pentylmaleimide, N-3-hydroxy-3-methyl-1-pentylmaleimide, N-3-hydroxy-3-methyl-2-pentylmaleimide, N-1-hydroxy-3-ethyl-4-butylmaleimide, N-2-hydroxy-3-ethyl-4-butylmaleimide, N-2-hydroxy-2-ethyl-1-butylmaleimide, N-4-hydroxy-3-ethyl-1-butylmaleimide, N-4-hydroxy-3-ethyl-2-butylmaleimide, N-4-hydroxy-3-ethyl-3-butylmaleimide, N-4-hydroxy-3-ethyl-4-butylmaleimide, N-1-hydroxy-2,3-dimethyl-1-butylmaleimide, N-1-hydroxy-2,3-dimethyl-2-butylmaleimide, N-1-hydroxy-2,3-dimethyl-3-butylmaleimide, N-1-hydroxy-2,3-dimethyl-4-butylmaleimide, N-2-hydroxy-2,3-dimethyl-1-butylmaleimide, N-2-hydroxy-2,3-dimethyl-3-butylmaleimide, N-2-hydroxy-2,3-dimethyl-4-butylmaleimide, N-1-hydroxy-2,2-dimethyl-1-butylmaleimide, N-1-hydroxy-2,2-dimethyl-3-butylmaleimide, N-1-hydroxy-2,2-dimethyl-4-butylmaleimide, N-2-hydroxy-3,3-dimethyl-1-butylmaleimide, N-2-hydroxy-3,3-dimethyl-2-butylmaleimide, N-2-hydroxy-3,3-dimethyl-4-butylmaleimide, N-1-hydroxy-3,3-dimethyl-1-butylmaleimide, N-1-hydroxy-3,3-dimethyl-2-butylmaleimide, N-1-hydroxy-3,3-dimethyl-4-butylmaleimide and the like; and cycloalkylmaleimides such as N-cyclopropylmaleimide, N-cyclobutylmaleimide, N-cyclopentylmaleimide, N-cyclohexylmaleimide, N-cycloheptylmaleimide, N-cyclooctylmaleimide, N-2-methylcyclohexylmaleimide, N-2-ethylcyclohexylmaleimide, N-2-chlorocyclohexylmaleimide and the like; and arylmaleimides such as N-phenylmaleimide, N-2-methylphenylmaleimide, N-2-ethylphenylmaleimide, N-2-chlorophenylmaleimide and the like.

Among them, cycloalkylmaleimides are preferably used from the viewpoints of a transparency and a solubility, and N-cyclohexylmaleimide and N-2-methylcyclohexylmaleimide are more preferably used. The above compounds can be used alone or in combination of two or more kinds thereof.

(Meth)acrylate which is a raw material of the repetitive unit (A-2) includes, for example, aliphatic (meth)acrylates such as methyl(meth)acrylate, ethyl(meth)acrylate, butyl (meth) acrylate, isobutyl(meth)acrylate, tert-butyl (meth)acrylate, butoxyethyl(meth)acrylate, isoamyl (meth)acrylate, hexyl (meth)acrylate, 2-ethylhexyl (meth)acrylate, heptyl(meth) acrylate, octyl(meth)acrylate, nonyl(meth)acrylate, decyl (meth)acrylate, undecyl (meth)acrylate, lauryl(meth) acrylate, tridecyl(meth)acrylate, tetradecyl(meth)acrylate, pentadecyl(meth)acrylate, hexadecyl(meth)acrylate, stearyl (meth)acrylate, vehenyl(meth)acrylate, 2-hydroxyethyl (meth)acrylate, 2-hydroxypropyl(meth)acrylate, 3-chloro-2-hydroxypropyl(meth)acrylate, 2-hydroxybutyl(meth) acrylate, methoxypolyethylene glycol(meth)acrylate, ethoxypolyethylene glycol(meth)acrylate, methoxypolypropylene glycol(meth)acrylate, ethoxypolypropylene glycol (meth)acrylate, mono(2-(meth)acryloyloxyethyl) succinate and the like; alicyclic(meth)acrylates such as cyclopentyl (meth)acrylate, cyclohexyl(meth)acrylate, dicyclopentanyl (meth)acrylate, dicyclopentenyl(meth)acrylate, isobornyl (meth)acrylate, mono(2-(meth)acryloyloxyethyl) tetrahydrophthalate, mono(2-(meth)acryloyloxyethyl) hexahydrophthalate and the like; aromatic(meth)acrylates such as benzyl(meth)acrylate, phenyl(meth)acrylate, o-biphenyl(meth)acrylate, 1-naphthyl(meth)acrylate, 2-naphthyl (meth)acrylate, phenoxyethyl(meth)acrylate, p-cumylphenoxyethyl(meth)acrylate, o-phenylphenoxyethyl(meth) acrylate, 1-naphthoxyethyl(meth)acrylate, 2-naphthoxyethyl (meth)acrylate, phenoxypolyethylene glycol(meth)acrylate, nonylphenoxypolyethylene glycol(meth)acrylate, phenoxypolypropylene glycol(meth)acrylate, 2-hydroxy-3-phenoxypropyl(meth)acrylate, 2-hydroxy-3-(o-phenylphenoxy)propyl(meth)acrylate, 2-hydroxy-3-(1-naphthoxy)propyl(meth) acrylate, 2-hydroxy-3-(2-naphthoxy)propyl(meth)acrylate and the like; alicyclic(meth)acrylates such as 2-tetrahydrofurfuryl(meth)acrylate, N-(meth)acryloyloxyethylhexahydrophthalimide, 2-(meth)acryloyloxyethyl-N-carbazole and the like; and caprolactone-modified compounds thereof.

Among them, preferred from the viewpoints of the transparency and the heat resistance are aliphatic (meth)acrylates such as methyl(meth)acrylate, ethyl(meth)acrylate, butyl (meth)acrylate, 2-ethylhexyl(meth)acrylate and the like; the alicyclic(meth)acrylates described above; the aromatic (meth)acrylates described above; and the alicyclic(meth) acrylates described above. The above compounds can be used alone or in combination of two or more kinds thereof.

The structures of the repetitive units (A-3) and (A-4) which originate in a compound having a carboxyl group and an ethylenically unsaturated group shall not specifically be restricted as long as they are represented by Formulas (3) and (4).

The compound having a carboxyl group and an ethylenically unsaturated group which is a raw material of the repetitive unit (A-3) includes, for example, (meth)acrylic acid, maleic acid, fumaric acid, crotonic acid, itaconic acid, citraconic acid, mesaconic acid, cinnamic acid and the like, and among them, (meth)acrylic acid, maleic acid, fumaric acid and crotonic acid are preferred from the viewpoints of the transparency and the developability.

Maleic anhydride is used as a raw material and polymerized, and then the polymer is subjected to ring opening by suitable alcohol such as methanol, ethanol, propanol and the like, whereby it may be converted to the structure of the repetitive unit (A-3). The above compounds can be used alone or in combination of two or more kinds thereof.

The compound having a carboxyl group and an ethylenically unsaturated group which is a raw material of the repetitive unit (A-4) includes, for example, mono(2-(meth)acryloyloxyethyl)succinate, mono(2-(meth)acryloyloxyethyl) phthalate, mono(2-(meth)acryloyloxyethyl)isophthalate, mono(2-(meth)acryloyloxyethyl)terephthalate, mono(2-(meth)acryloyloxyethyl)tetrahydrophthalate, mono(2-(meth)acryloyloxyethyl)hexahydrophthalate, mono(2-(meth)acryloyloxyethyl)hexahydroisophthalate, mono(2-(meth)acryloyloxyethyl)hexahydroterephthalate, ω-carboxy-polycaprolactone(meth)acrylate, 3-vinylbenzoic acid, 4-vinylbenzoic acid and the like.

Among them, preferred from the viewpoints of the transparency and the solubility in alkali are mono(2-(meth)acryloyloxyethyl)succinate, mono(2-(meth)acryloyloxyethyl) tetrahydrophthalate, mono(2-(meth)acryloyloxyethyl) hexahydrophthalate, mono(2-(meth)acryloyloxyethyl) hexahydroisophthalate and mono(2-(meth)acryloyloxyethyl) hexahydroterephthalate. The above compounds can be used alone or in combination of two or more kinds thereof.

The alkali-soluble (meth)acryl polymer having a maleimide skeleton on a principal chain of the component (A) may comprise, if necessary, a repetitive unit other than the repetitive units (A-1) to (A-4).

The compound having an ethylenically unsaturated group which is a raw material of the above repetitive units shall not specifically be restricted and includes, for example, styrene, α-methylstyrene, vinyltoluene, vinyl chloride, vinyl acetate, vinylpyridine, N-vinylpyrrolidone, N-vinylcarbazole, butadiene, isoprene, chloroprene and the like. Among them, styrene, α-methylstyrene, vinyltoluene and N-vinylcarbazole are more preferably used from the viewpoints of the heat resistance and the transparency. The above compounds can be used alone or in combination of two or more kinds thereof.

The vinyl polymer having at least one chain-polymerizable functional group in a molecule shall not specifically be restricted in a synthetic process therefor, and it can be obtained, for example, by copolymerizing the maleimide which is a raw material of the repetitive unit (A-1), the (meth) acrylate which is a raw material of the repetitive unit (A-2), the compound having a carboxyl group and an ethylenically unsaturated group which is a raw material of the repetitive units (A-3) and/or (A-4) and, if necessary, other compounds having an ethylenically unsaturated group using a suitable heat radical polymerization initiator while heating them. In this case, an organic solvent can be used, if necessary, as a reaction solvent.

The heat radical polymerization initiator shall not specifically be restricted and includes, for example, ketone peroxides such as methyl ethyl ketone peroxide, cyclohexanone peroxide, methylcyclohexanone peroxide and the like; peroxy ketals such as 1,1-bis(t-butylperoxy)cyclohexane, 1,1-bis(t-butylperoxy)-2-methylcyclohexane, 1,1-bis(t-butylperoxy)-3,3,5-trimethylcyclohexane, 1,1-bis(t-hexylperoxy) cyclohexane, 1,1-bis(t-hexylperoxy)-3,3,5-trimethylcyclohexane and the like; hydroperoxides such as p-menthane hydroperoxide and the like; dialkyl peroxides such as α,α'-bis(t-butylperoxy)diisopropylbenzene, dicumyl peroxide, t-butylcumyl peroxide, di-t-butyl peroxide and the like; diacyl peroxides such as octanoyl peroxide, lauroyl peroxide, stearyl peroxide, benzoyl peroxide and the like; peroxy carbonates such as bis(4-t-butylcyclohexyl)peroxy dicarbonate, di-2-ethoxyethylperoxy dicarbonate, di-2-ethylhexylperoxy dicarbonate, di-3-methoxybutylperoxy carbonate and the like; peroxy esters such as t-butylperoxy pivalate, t-hexylperoxy pivalate, 1,1,3,3-tetramethylbutylperoxy 2-ethylhexanoate, 2,5-dimethyl-2,5-bis(2-ethylhexanoylperoxy)hexane, t-hexylperoxy 2-ethylhexanoate, t-butylperoxy 2-ethylhexanoate, t-butylperoxy isobutyrate, t-hexylperoxy isopropyl monocarbonate, t-butylperoxy-3,5,5-trimethyl hexanoate, t-butylperoxy laurate, t-butylperoxy isopropyl monocarbonate, t-butylperoxy 2-ethylhexyl monocarbonate, t-butylperoxy benzoate, t-hexylperoxy benzoate, 2,5-dimethyl-2,5-bis(benzoylperoxy)hexane, t-butylperoxy acetate and the like; and azo compounds such as 2,2'-azobisisobutyronitrile, 2,2'-azobis(2,4-dimethylvaleronitrile), 2,2'-azobis (4-methoxy-2'-dimethylvaleronitrile) and the like.

The organic solvent used as the reaction solvent shall not specifically be restricted as long as it can dissolve the alkali-soluble (meth)acryl polymer having a maleimide skeleton on a principal chain of the component (A), and it include, for example, aromatic hydrocarbons such as toluene, xylene, mesitylene, cumene, p-cymene and the like; cyclic ethers such as tetrahydrofuran, 1,4-dioxane and the like; alcohols such as methanol, ethanol, isopropanol, butanol, ethylene glycol, propylene glycol and the like; ketones such as acetone, methyl ethyl ketone, methyl isobutyl ketone, cyclohexanone, 4-hydroxy-4-methyl-2-pentanone and the like; esters such as methyl acetate, ethyl acetate, butyl acetate, methyl lactate, ethyl lactate, γ-butyrolactone and the like; carbonic esters such as ethylene carbonate, propylene carbonate and the like; polyhydric alcohol alkyl ethers such as ethylene glycol monomethyl ether, ethylene glycol monoethyl ether, ethylene glycol monobutyl ether, ethylene glycol dimethyl ether, ethylene glycol diethyl ether, propylene glycol monomethyl ether, propylene glycol monoethyl ether, propylene glycol dimethyl ether, propylene glycol diethyl ether, diethylene glycol monomethyl ether, diethylene glycol monoethyl ether, diethylene glycol monobutyl ether, diethylene glycol dimethyl ether, diethylene glycol diethyl ether and the like; polyhydric alcohol alkyl ether acetates such as ethylene glycol monomethyl ether acetate, ethylene glycol monoethyl ether acetate, ethylene glycol monobutyl ether acetate, propylene glycol monomethyl ether acetate, propylene glycol monoethyl ether acetate, diethylene glycol monomethyl ether acetate, diethylene glycol monoethyl ether acetate and the like; and amides such as N,N-dimethylformamide, N,N-dimethylacetamide, N-methylpyrrolidone and the like. The above organic solvents can be used alone or in combination of two or more kinds thereof.

Further, the component (A) has at least one chain-polymerizable functional group on a side chain in a molecule. The chain-polymerizable functional group includes, to be specific, an ethylenically unsaturated group such as a vinyl group, an acryl group, a methacryl group, an allyl group, a styryl group and the like and a glycidyl group.

A composition thereof and a production process therefor shall not specifically be restricted, and the (meth)acryl polymer which is the component (A) can be subjected to addition reaction with a compound having at least one ethylenically unsaturated group and one functional group such as an epoxy group, an oxetanyl group, an isocyanate group, a hydroxyl group, a carboxyl group and the like to thereby introduce an ethylenically unsaturated group into a side chain thereof.

The above compounds shall not specifically be restricted and include, for example, compounds having an ethylenically unsaturated group and an epoxy group, such as glycidyl (meth)acrylate, α-ethylglycidyl(meth)acrylate, α-propylglycidyl(meth)acrylate, α-butylglycidyl(meth) acrylate, 2-methylglycidyl(meth)acrylate, 2-ethylglycidyl(meth)acrylate, 2-propylglycidyl(meth)acrylate, 3,4-epoxybutyl(meth)acrylate, 3,4-epoxyheptyl(meth)acrylate, α-ethyl-6,7-epoxyheptyl(meth)acrylate, 3,4-epoxycyclohexylmethyl(meth)acrylate, o-vinylbenzyl glycidyl ether, m-vinylbenzyl glycidyl ether, p-vinylbenzyl glycidyl ether and the like; compounds having an ethylenically unsaturated group and an oxetanyl group, such as (2-ethyl-2-oxetanyl)methyl(meth)acrylate, (2-methyl-2-oxetanyl)methyl(meth)acrylate, 2-(2-ethyl-2-oxetanyl)ethyl(meth)acrylate, 2-(2-methyl-2-oxetanyl)ethyl (meth)acrylate, 3-(2-ethyl-2-oxetanyl)propyl(meth)acrylate, 3-(2-methyl-2-oxetanyl)propyl(meth)acrylate and the like; compounds having an ethylenically unsaturated group and an isocyanate group, such as 2-methacryloyloxyethyl isocyanate, 1,1-bis[meth(acryl)oxymethyl]ethyl isocyanate, 2-{[2-[meth(acryl)oxy]ethoxy}ethyl isocyanate and the like; compounds having an ethylenically unsaturated group and a hydroxy group, such as 2-hydroxyethyl(meth)acrylate, 2-hydroxypropyl(meth)acrylate, 3-chloro-2-hydroxypropyl (meth)acrylate, 2-hydroxybutyl(meth)acrylate and the like; and compounds having an ethylenically unsaturated group and a carboxy group, such as (meth)acrylic acid, crotonic acid, cinnamic acid, (2-(meth)acryloyloxyethyl)succinate, 2-phthaloylethyl(meth)acrylate, 2-tetrahydrophthaloylethyl (meth)acrylate, 2-hexahydrophthaloylethyl(meth)acrylate, ω-carboxy-polycaprolactone mono(meth)acrylate, 3-vinylbenzoic acid, 4-vinylbenzoic acid and the like.

Among them, preferred from the viewpoints of the transparency and the reactivity are glycidyl(meth)acrylate, 3,4-epoxycyclohexylmethyl(meth)acrylate, 2-(meth)acryloyloxyethyl isocyanate, 1,1-bis[meth(acryl)oxymethyl]ethyl isocyanate, 2-{[2-[meth(acryl)oxy]ethoxy}ethyl isocyanate, 2-hydroxyethyl(meth)acrylate, 2-hydroxypropyl(meth)acrylate, 2-hydroxybutyl(meth)acrylate, (meth)acrylic acid, crotonic acid and 2-hexahydrophthaloylethyl(meth)acrylate. The above compounds can be used alone or in combination of two or more kinds thereof.

A weight average molecular weight of the component (A) is preferably 1,000 to 3,000,000. If it is 1,000 or more, the cured matter of the resin composition comprising the same has a sufficiently large strength because of a large molecular weight, and if it is 3,000,000 or less, the component (A) is provided with a good solubility in a developer comprising an alkaline aqueous solution and a good compatibility with the polymerizable compound (B). From the viewpoints described above, the weight average molecular weight is more preferably 3,000 to 2,000,000, further preferably 5,000 to 1,000,000

The weight average molecular weight in the present invention is a value measured by gel penetration chromatography (GPC) and reduced to standard polystyrene.

Also, the component (A) is preferably soluble in aqueous solutions of carbonates of alkali metals or alkali earth metals. In this respect, the specific examples of the carbonates of alkali metals and alkali earth metals include lithium carbonate, sodium carbonate, potassium carbonate, rubidium carbonate, cesium carbonate, sodium hydrogencarbonate, potassium hydrogencarbonate, rubidium hydrogencarbonate, cesium hydrogencarbonate, beryllium carbonate, magnesium carbonate, calcium carbonate, strontium carbonate, barium carbonate and the like. In particular, sodium carbonate and potassium carbonate are preferred since they are inexpensive and have a low toxicity to human bodies. A concentration thereof in an aqueous solution shall not specifically be restricted, and they are preferably soluble in a carbonate aqueous solution of 1 to 10% by mass. Use of the above component (A) makes it possible to readily form patterns in a photolithographic process.

A blending amount of the component (A) is preferably 10 to 85% by mass based on the whole amount of the component (A) and the component (B). If it is 10% by mass or more, the cured matter of the photosensitive resin composition is satisfactory in a strength and a flexibility. If it is 85% by mass or less, the component (A) is involved in the component (B) and readily cured, and it is not short of a developer resistance. From the viewpoints described above, a blending amount of the component (A) is more preferably 20 to 80% by mass, further preferably 25 to 75% by mass.

The polymerizable compound (B) used in the present invention shall be explained below.

The polymerizable compound of the component (B) shall not specifically be restricted as long as it is cured by heat or irradiation with an actinic ray such as an ultra violet ray, and it includes suitably, for example, compounds having a polymerizable substituent such as an ethylenically unsaturated group and the like.

To be specific, it includes (meth)acrylates, vinylidene halides, vinyl ethers, vinyl esters, vinylpyridine, vinylamide, arylated vinyl and the like, and among them, (meth)acrylates and arylated vinyl are preferred from the viewpoint of the transparency. Any of the monofunctional compounds and the multifunctional compounds which are higher than trifunctional can be used as the (meth)acrylate.

The monofunctional (meth)acrylate includes, for example, aliphatic (meth)acrylates such as methyl(meth)acrylate, ethyl (meth)acrylate, butyl(meth)acrylate, isobutyl(meth)acrylate, tert-butyl(meth)acrylate, butoxyethyl(meth)acrylate, isoamyl(meth)acrylate, hexyl(meth)acrylate, 2-ethylhexyl (meth)acrylate, heptyl(meth)acrylate, octyl(meth)acrylate, nonyl(meth)acrylate, decyl(meth)acrylate, undecyl(meth) acrylate, lauryl(meth)acrylate, tridecyl(meth)acrylate, tetradecyl(meth)acrylate, pentadecyl(meth)acrylate, hexadecyl (meth)acrylate, stearyl(meth)acrylate, vehenyl(meth) acrylate, 2-hydroxyethyl(meth)acrylate, 2-hydroxypropyl (meth)acrylate, 3-chloro-2-hydroxypropyl(meth)acrylate, 2-hydroxybutyl(meth)acrylate, methoxypolyethylene glycol (meth)acrylate, ethoxypolyethylene glycol(meth)acrylate, methoxypolypropylene glycol(meth)acrylate, ethoxypolypropylene glycol(meth)acrylate, mono(2-(meth)acryloyloxyethyl)succinate and the like; alicyclic(meth)acrylates such as cyclopentyl(meth)acrylate, cyclohexyl(meth)acrylate, dicyclopentanyl(meth)acrylate, dicyclopentenyl(meth) acrylate, isobornyl(meth)acrylate, mono(2-(meth)acryloyloxyethyl)tetrahydrophthalate, mono(2-(meth) acryloyloxyethyl)hexahydrophthalate and the like; aromatic (meth)acrylates such as benzyl(meth)acrylate, phenyl(meth) acrylate, o-biphenyl(meth)acrylate, 1-naphthyl(meth) acrylate, 2-naphthyl(meth)acrylate, phenoxyethyl(meth) acrylate, p-cumylphenoxyethyl(meth)acrylate, o-phenylphenoxyethyl(meth)acrylate, 1-naphthoxyethyl (meth)acrylate, 2-naphthoxyethyl(meth)acrylate, phenoxypolyethylene glycol(meth)acrylate, nonylphenoxypolyethylene glycol(meth)acrylate, phenoxypolypropylene glycol (meth)acrylate, 2-hydroxy-3-phenoxypropyl(meth)acrylate, 2-hydroxy-3-(o-phenylphenoxy)propyl(meth)acrylate, 2-hydroxy-3-(1-naphthoxy)propyl(meth)acrylate, 2-hydroxy-3-(2-naphthoxy)propyl(meth)acrylate and the like; heterocyclic(meth)acrylates such as 2-tetrahydrofurfuryl(meth) acrylate, N-(meth)acryloyloxyethylhexahydrophthalimide, 2-(meth)acryloyloxyethyl-N-carbazole and the like; and caprolactone-modified compounds thereof.

Among them, preferred from the viewpoints of the transparency and the heat resistance are the alicyclic(meth)acrylates described above; the aromatic(meth)acrylates described above; and the heterocyclic(meth)acrylates described above.

When commercial products of the above compounds are used, they can be used as they are, but they may be used after refined, if necessary, before use by subjecting them to distillation and separation with a column.

The difunctional (meth)acrylate includes, for example, aliphatic (meth)acrylates such as ethylene glycol di(meth)acrylate, diethylene glycol di(meth)acrylate, triethylene glycol di(meth)acrylate, tetraethylene glycol di(meth)acrylate, polyethylene glycol di(meth)acrylate, propylene glycol di(meth)acrylate, dipropylene glycol di(meth)acrylate, tripropylene glycol di(meth)acrylate, tetrapropylene glycol di(meth)acrylate, polypropylene glycol di(meth)acrylate, ethoxylated polypropylene glycol di(meth)acrylate, 1,3-butanediol di(meth)acrylate, 1,4-butanediol di(meth) acrylate, neopentyl glycol di(meth) acrylate, 3-methyl-1,5-pentanediol di(meth)acrylate, 1,6-hexanediol di(meth)acrylate, 2-butyl-2-ethyl-1,3-propanediol di(meth)acrylate, 1,9-nonanediol di(meth)acrylate, 1,10-decanediol di(meth)acrylate, glycerin di(meth)acrylate, tricyclodecanedimethanol (meth)acrylate, ethoxylated 2-methyl-1,3-propanediol di(meth)acrylate and the like; alicyclic(meth)acrylates such as cyclohexanedimethanol(meth)acrylate, ethoxylated cyclohexanedimethanol(meth)acrylate, propoxylated cyclohexanedimethanol(meth)acrylate, ethoxylated propoxylated cyclohexanedimethanol(meth)acrylate, tricyclodecanedimethanol(meth)acrylate, ethoxylated tricyclodecanedimethanol(meth)acrylate, propoxylated tricyclodecanedimethanol(meth)acrylate, ethoxylated propoxylated tricyclodecanedimethanol(meth)acrylate, ethoxylated hydrogenated bisphenol A di(meth)acrylate, propoxylated hydrogenated bisphenol A di(meth)acrylate, ethoxylated propoxylated hydrogenated bisphenol A di(meth)acrylate, ethoxylated hydrogenated bisphenol F di(meth)acrylate, propoxylated hydrogenated bisphenol F di(meth)acrylate, ethoxylated propoxylated hydrogenated bisphenol F di(meth)acrylate and the like; aromatic (meth)acrylates such as ethoxylated bisphenol A di(meth)acrylate, propoxylated bisphenol A di(meth)acrylate, ethoxylated propoxylated bisphenol A di(meth)acrylate, ethoxylated bisphenol F di(meth)acrylate, propoxylated bisphenol F di(meth)acrylate, ethoxylated propoxylated bisphenol F di(meth)acrylate, ethoxylated bisphenol AF di(meth)acrylate, propoxylated bisphenol AF di(meth)acrylate, ethoxylated propoxylated bisphenol AF di(meth)acrylate, ethoxylated fluorene type di(meth)acrylate, propoxylated fluorene type di(meth)acrylate, ethoxylated propoxylated fluorene type di(meth)acrylate and the like; heterocyclic(meth)acrylates such as ethoxylated isocyanuric acid di(meth)acrylate, propoxylated isocyanuric acid di(meth)acrylate, ethoxylated propoxylated isocyanuric acid di(meth)acrylate and the like; caprolactone-modified compounds thereof; aliphatic epoxy(meth)acrylates such as neopentyl glycol type epoxy(meth)acrylate and the like; alicyclic epoxy(meth)acrylates such as cyclohexanedimethanol type epoxy(meth)acrylate, hydrogenated bisphenol A type epoxy(meth)acrylate, hydrogenated bisphenol F type epoxy (meth)acrylate and the like; and aromatic epoxy(meth)acrylates such as resorcinol type epoxy(meth)acrylate, bisphenol A type epoxy(meth)acrylate, bisphenol F type epoxy(meth) acrylate, bisphenol AF type epoxy(meth)acrylate, fluorene type epoxy(meth)acrylate and the like.

Among them, preferred from the viewpoints of the transparency and the heat resistance are the alicyclic(meth)acrylates described above; the aromatic(meth)acrylates described above; the heterocyclic(meth)acrylates described above; the alicyclic epoxy(meth)acrylates described above; and the aromatic epoxy(meth)acrylates described above.

When commercial products of the above compounds are used, they can be used as they are, but they may be used after refined, if necessary, before use by subjecting them to distillation and separation with a column.

The multifunctional (meth)acrylate which is higher than trifunctional includes, for example, aliphatic (meth)acrylates such as trimethylolpropane tri(meth)acrylate, ethoxylated trimethylolpropane tri(meth)acrylate, propoxylated trimethylolpropane tri(meth)acrylate, ethoxylated propoxylated trimethylolpropane tri(meth)acrylate, pentaerythritol tri(meth) acrylate, ethoxylated pentaerythritol tri(meth)acrylate, propoxylated pentaerythritol tri(meth)acrylate, ethoxylated propoxylated pentaerythritol tri(meth)acrylate, pentaerythritol tetra(meth)acrylate, ethoxylated pentaerythritol tetra (meth)acrylate, propoxylated pentaerythritol tetra(meth) acrylate, ethoxylated propoxylated pentaerythritol tetra (meth)acrylate, ditrimethylolpropane tetra(meth)acrylate, dipentaerythritol hexa(meth)acrylate and the like; heterocyclic(meth)acrylates such as ethoxylated isocyanuric acid tri (meth)acrylate, propoxylated isocyanuric acid tri(meth)acrylate, ethoxylated propoxylated isocyanuric acid tri(meth) acrylate and the like; caprolactone-modified compounds thereof; and aromatic epoxy(meth)acrylates such as phenol novolak type epoxy(meth)acrylate, cresol novolak type epoxy(meth)acrylate and the like.

Among them, the heterocyclic(meth)acrylates and the aromatic epoxy(meth)acrylates are preferred from the viewpoints of the transparency and the heat resistance.

The above compounds can be used alone or in combination of two or more kinds thereof, and they can be used as well in combination with other polymerizable compounds.

When commercial products of the above compounds are used, they can be used as they are, and they may be used after refined, if necessary, before use by subjecting them to distillation and separation with a column.

A compound having at least one selected from the group consisting of an alicyclic structure, an aryl group, an aryloxy group and an aralkyl group and an ethylenically unsaturated group is preferably used as the polymerizable compound of the component (B) from the viewpoint of the heat resistance. To be specific, it includes (meth)acrylate or N-vinylcarbazole having at least one selected from the group consisting of an alicyclic structure, an aryl group, an aryloxy group and an aralkyl group. The aryl group represents, for example, an aromatic hydrocarbon group such as a phenyl group, a naphthyl group and the like and an aromatic heterocyclic group such as a carbazole group and the like. The above compounds can be used alone or in combination of two or more kinds thereof.

To be more specific, the polymerizable compound of the component (B) is preferably a compound having an aryl group and an ethylenically unsaturated group, and it includes suitably compounds represented by the following Formulas (5) to (8):

[Formula 5]

(5)

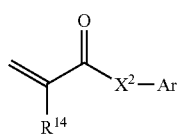

in Formula (5), $R^{14}$ is a hydrogen atom or methyl; $X^2$ is a divalent group represented by O (hydrogen atom), S (sulfur atom), $OCH_2$, $SCH_2$, $O(CH_2CH_2O)_a$, $O[CH_2CH(CH_3)O]_b$ or $OCH_2CH(OH)CH_2O$, and a and b each represent independently an integer of 1 to 20; and Ar is any of monovalent organic groups represented by the following formulas:

[Formula 6]

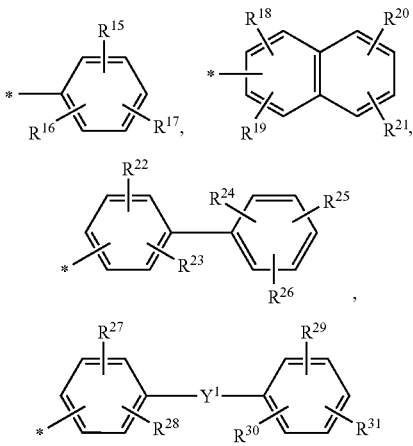

wherein $R^{15}$ to $R^{31}$ each are independently any of a hydrogen atom, a fluorine atom, a monovalent organic group having 1 to 20 carbon atoms and a monovalent fluorine-containing organic group having 1 to 20 carbon atoms; $Y^1$ is any of divalent groups represented by the following formulas, and it is bonded to $X^2$ at a part of a * mark:

[Formula 7]

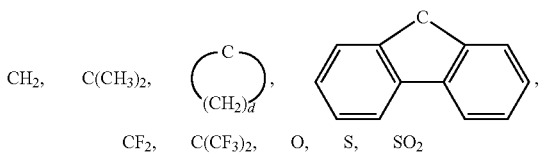

wherein d is an integer of 2 to 10;

[Formula 8]

(6)

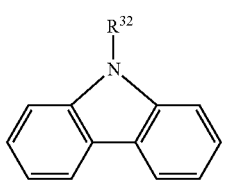

in Formula (6), $R^{32}$ is any of monovalent organic groups represented by the following formulas, and it is bonded to N at a part of a * mark:

[Formula 9]

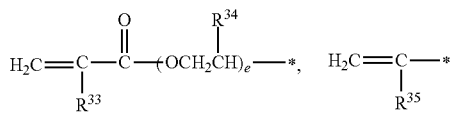

wherein $R^{33}$ to $R^{35}$ each are independently a hydrogen atom or methyl; and e represents an integer of 1 to 10;

[Formula 10]

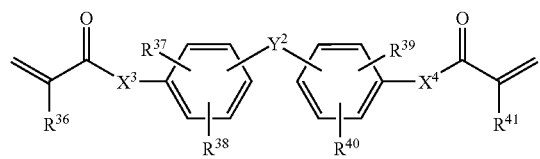

(7)

in Formula (7), $R^{36}$ and $R^{41}$ each are independently a hydrogen atom or methyl; $R^{37}$ to $R^{40}$ each are independently any of a hydrogen atom, a fluorine atom, a monovalent organic group having 1 to 20 carbon atoms and a monovalent fluorine-containing organic group having 1 to 20 carbon atoms; $X^3$ and $X^4$ each are independently a divalent group represented by O, S, $O(CH_2CH_2O)_f$ or $O[CH_2CH(CH_3)O]_g$, and f and g each represent independently an integer of 1 to 20; and $Y^2$ is any of divalent groups represented by the following formulas:

[Formula 11]

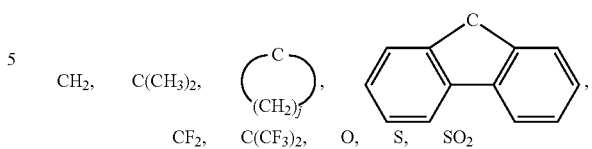

wherein h is an integer of 2 to 10;

[Formula 12]

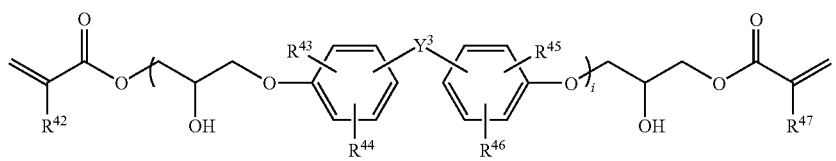

(8)

in Formula (8), $R^{42}$ and $R^{47}$ each are independently a hydrogen atom or methyl; $R^{43}$ to $R^{46}$ each are independently any of a hydrogen atom, a fluorine atom, a monovalent organic group having 1 to 20 carbon atoms and a monovalent fluorine-containing organic group having 1 to 20 carbon atoms; $Y^3$ is any of divalent groups represented by the following formulas, and i is an integer of 1 to 5:

[Formula 13]

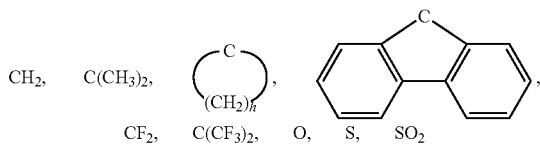

wherein j is an integer of 2 to 10.

The organic groups in Formulas (5) to (8) include the same examples explained in Formulas (1) to (4).

When commercial products of the above compounds are used, they can be used as they are, but they may be used after refined, if necessary, before use by subjecting them to distillation and separation with a column.

A blending amount of the polymerizable compound of the component (B) is preferably 15 to 90% by mass based on the whole amount of the component (A) and the component (B). If it is 15% by mass or more, the component (B) is readily cured while forming a chemical bond with a polymer chain of the component (A), and it is not short of a developer resistance. If it is 90% by mass or less, the cured film is satisfactory in a film strength and a flexibility. From the viewpoints described above, a blending amount of the component (B) is more preferably 30 to 80% by mass.

Further, so-called additives such as antioxidants, yellowing preventives, UV absorbers, visible light absorbing agents, coloring agents, plasticizers, stabilizers, fillers, fluorescent brightening agents and the like in addition to the component (A), the component (B) and the component (C) may be added, if necessary, to the photosensitive resin composition of the present invention in a proportion in which an adverse influence is not exerted to the effects of the present invention.

The photosensitive resin composition of the present invention may be diluted with a suited organic solvent and used in the form of a photosensitive resin varnish. The organic solvent used above shall not specifically be restricted as long as it can dissolve the above resin composition and includes, for example, aromatic hydrocarbons such as toluene, xylene, mesitylene, cumene, p-cymene and the like; cyclic ethers such as tetrahydrofuran, 1,4-dioxane and the like; alcohols such as methanol, ethanol, isopropanol, butanol, ethylene glycol, propylene glycol and the like; ketones such as acetone, methyl ethyl ketone, methyl isobutyl ketone, cyclohexanone, 4-hydroxy-4-methyl-2-pentanone and the like; esters such as methyl acetate, ethyl acetate, butyl acetate, methyl lactate, ethyl lactate, γ-butyrolactone and the like; carbonic esters such as ethylene carbonate, propylene carbonate and the like; polyhydric alcohol alkyl ethers such as ethylene glycol monomethyl ether, ethylene glycol monoethyl ether, ethylene glycol monobutyl ether, ethylene glycol dimethyl ether, ethylene glycol diethyl ether, propylene glycol monomethyl ether, propylene glycol monoethyl ether, propylene glycol dimethyl ether, propylene glycol diethyl ether, diethylene glycol monomethyl ether, diethylene glycol monoethyl ether, diethylene glycol monobutyl ether, diethylene glycol dimethyl ether, diethylene glycol diethyl ether and the like; polyhydric alcohol alkyl ether acetates such as ethylene glycol monomethyl ether acetate, ethylene glycol monoethyl ether acetate, ethylene glycol monobutyl ether acetate, propylene glycol monomethyl ether acetate, propylene glycol monoethyl ether acetate, diethylene glycol monomethyl ether acetate, diethylene glycol monoethyl ether acetate and the like; and amides such as N,N-dimethylformamide, N,N-dimethylacetamide, N-methylpyrrolidone and the like.

Among them, preferred from the viewpoints of a solubility and a boiling point are toluene, methanol, ethanol, isopropanol, acetone, methyl ethyl ketone, methyl isobutyl ketone, cyclohexanone, methyl acetate, ethyl acetate, butyl acetate, methyl lactate, ethyl lactate, ethylene glycol monomethyl ether, ethylene glycol monoethyl ether, propylene glycol monomethyl ether, propylene glycol monoethyl ether, diethylene glycol dimethyl ether, ethylene glycol monomethyl ether acetate, propylene glycol monomethyl ether acetate and N,N-dimethylacetamide. The above organic solvents can be used alone or in combination of two or more kinds thereof.

A solid matter concentration in the resin varnish is preferably 20 to 80% by mass.

When preparing the photosensitive resin varnish, mixing is carried out preferably by stirring. The stirring method shall not specifically be restricted, and stirring carried out by using propellers is preferred from the viewpoint of a stirring efficiency. A rotating speed of a propeller in stirring shall not specifically be restricted and is preferably 10 to 1,000 $min^{-1}$. If it is 10 $min^{-1}$ or more, the respective components (A) to (C) and the organic solvent are sufficiently mixed, and if it is 1,000 $min^{-1}$ or less, introduction of air bubbles by rotation of a propeller is decreased. From the viewpoints described above, the rotating speed is more preferably 50 to 800 $min^{-1}$, further preferably 100 to 500 $min^{-1}$.

The stirring time shall not specifically be restricted as well and is preferably 1 to 24 hours. If it is one hour or longer, the respective components (A) to (C) and the organic solvent are sufficiently mixed. If it is 24 hours or shorter, a preparing time of the varnish can be shortened, and the sufficiently high productivity is obtained.

The photosensitive resin varnish prepared is filtrated preferably by using a filter having a pore diameter of 50 μm or less. Use of the filter having a pore diameter of 50 μm or less allows large foreign matters to be removed, prevents cissing from being caused in coating the varnish and inhibits scattering of light propagated through a core part. From the viewpoints described above, the filter having a pore diameter of more preferably 30 μm or less, further preferably 10 μm or less is used for filtrating.

The photosensitive resin varnish prepared is defoamed preferably under reduced pressure. The defoaming method shall not specifically be restricted, and a vacuum pump, a bell jar and a defoaming device equipped with a vacuum device can be used as the specific examples thereof. The vacuum degree in reducing the pressure shall not specifically be restricted and is preferably a range in which the organic solvent contained in the varnish is not boiled. The defoaming time under reduced pressure shall not specifically be restricted and is preferably 3 to 60 minutes. If it is 3 minutes or longer, air bubbles dissolved in the resin varnish can be removed. If it is 60 minutes or shorter, the organic solvent contained in the resin varnish is not volatilized.

The photosensitive resin film of the present invention shall be explained below.

The photosensitive resin film of the present invention comprises the photosensitive resin composition described above and can readily be produced by coating the photosensitive resin varnish containing the respective components (A) to (C) described above on a suited substrate film and removing the solvent to form a photosensitive resin layer (hereinafter referred to merely as the "resin layer"). The photosensitive resin film may be produced by coating the photosensitive resin composition directly on the substrate film without turning it into the varnish.

The substrate film shall not specifically be restricted and includes, for example, polyesters such as polyethylene terephthalate, polybutylene terephthalate, polyethylene naphthalate and the like; polyolefins such as polyethylene, polypropylene, polyethylene-vinyl acetate copolymers and the like; polyvinyl chloride, polyvinylidene chloride, polycarbonate, polyamide, polyimide, polyamideimide, polyetherimide, polyether sulfide, polyethersulfone, polyether ketone, polyphenylene ether, polyphenylene sulfide, polyallylate, polysulfone, liquid crystal polymers and the like.

Among them, preferred from the viewpoints of a flexibility and a toughness are polyethylene terephthalate, polybutylene terephthalate, polyethylene naphthalate, polypropylene, polyethylene-vinyl acetate copolymers, polycarbonate, polyamide, polyimide, polyamideimide, polyphenylene ether, polyphenylene sulfide, polyallylate and polysulfone.

A thickness of the substrate film may suitably be changed according to a flexibility targeted, and it is preferably 3 to 250 μm. If it is 3 μm or more, the film strength is sufficiently high, and if it is 250 μm or less, the satisfactory flexibility is obtained. From the viewpoints described above, the thickness is more preferably 5 to 200 μm, further preferably 7 to 150 μm. The film subjected to mold release treatment with a silicone base compound, a fluorine-containing compound and the like may be used, if necessary, from the viewpoint of enhancing an improvement in a peeling property from the resin layer.

The photosensitive resin film produced by coating the photosensitive resin varnish or the photosensitive resin composition on the substrate film may assume a three layer structure in which a protective film is stuck, if necessary, on the resin layer and which comprises the substrate film, the resin layer comprising the photosensitive resin composition or the photosensitive resin cured matter and the protective layer.

The protective film shall not specifically be restricted and includes, for example, polyesters such as polyethylene terephthalate, polybutylene terephthalate, polyethylene naphthalate and the like; and polyolefins such as polyethylene, polypropylene and the like. Among them, preferred from the viewpoints of a flexibility and a toughness are polyesters such as polyethylene terephthalate and the like; and polyolefins such as polyethylene, polypropylene and the like. The film subjected to mold release treatment with a silicone base compound, a fluorine-containing compound and the like may be used, if necessary, from the viewpoint of enhancing an improvement in a peeling property from the resin layer.

A thickness of the protective film may suitably be changed according to a flexibility targeted, and it is preferably 10 to 250 μm. If it is 10 μm or more, the film strength is sufficiently high, and if it is 250 μm or less, the satisfactory flexibility is obtained. From the viewpoints described above, the thickness is more preferably 15 to 200 μm, further preferably 20 to 150 μm.

A thickness of the photosensitive resin film of the present invention shall not specifically be restricted, and it is preferably 5 to 500 µm in terms of a thickness after cured. If it is 5 µm or more, the thickness is sufficiently large, and therefore the resin film or a cured matter of the above film has a satisfactory strength. If it is 500 µm or less, the resin film can sufficiently be dried, and therefore an amount of the solvent remaining therein is not increased, so that the cured matter of the above film is not foamed when heated.

The photosensitive resin film thus obtained can readily be stored by rolling in a roll form. Or, the film of a roll form can be cut to a suited size and stored as well in a sheet form.

The photosensitive resin composition of the present invention is suited as a resin composition for forming an optical waveguide, and similarly the photosensitive resin film of the present invention is suited as a resin film for forming an optical waveguide.

The photosensitive resin composition is subjected to curing reaction or polymerization reaction by light, heat and the like, whereby a cured matter thereof can be obtained. In this case, it is turned in advance to an optional form such as a sheet, a film, a strip and the like and then subjected to curing reaction and the like, whereby a cured matter having an optional form can be obtained. The cured matter thus obtained can also be used as a device for illumination as is the case with conventional optical waveguides by using in an air clad.

In irradiating the cured matter obtained by subjecting the photosensitive resin composition to curing reaction with a white LED light, it is irradiated preferably with a transmitted light in which a ratio of a transmitted light intensity in the vicinity of 560 nm to a transmitted light intensity in the vicinity of 460 nm is 1:1 to 1:4. If it is 1:1 or more, a transmitted light is close to a light emitted from an original light source, and a device suited to illumination use can be obtained. It is practically impossible to obtain the ratio of 1:4 or more.

In order to obtain a ratio of 1:1 to 1:4 of a transmitted light intensity in the vicinity of 560 nm to a transmitted light intensity in the vicinity of 460 nm in irradiating with the white LED light described above, the component (C) is at least one selected from the group consisting of 2-[2-oxo-2-phenylacetoxyethoxy]ethyl oxyphenylacetate, 2-(2-hydroxyethoxy) ethyl oxyphenylacetate and oligo{2-hyroxy-2-methyl-1-[4-(1-methylvinyl)phenyl]}propanone; a content of the component (C) is 0.5 to 5.0 parts by mass based on total 100 parts by mass of the component (A) and the component (B); and in addition thereto, the respective molecular skeletons of the component (A) and the component (B) assume a constitution comprising no chemical structure having electron transition absorption in which light can be absorbed in a range of 420 to 500 nm and no chemical structure in which two or more aromatic rings are bonded directly thereto, whereby the above transmitted light intensity ratio is achieved.

The optical waveguide of the present invention shall be explained below.

A cross-sectional drawing of an optical waveguide is shown in (a) of FIG. 1. An optical waveguide 1 is formed on a substrate 5 and constituted from a core part 2 comprising a resin composition for forming a core part having a high refraction index and a lower cladding layer 4 and an upper cladding layer 3 which comprise a resin composition for forming a cladding layer having a low refraction index.

The photosensitive resin composition and the photosensitive resin film according to the present invention are used preferably for at least one of the lower cladding layer 4, the core part 2 and the upper cladding layer 3 in the optical waveguide 1. The photosensitive resin composition and the photosensitive resin film according to the present invention have the characteristic that they can form patterns with a developer comprising an alkaline aqueous solution, and therefore they are used particularly for the core part 2 to thereby exert further more effects.

Use of the photosensitive resin film makes it possible to enhance more an interlayer adhesion between the clad and the core and a pattern-forming property (corresponding property between fine lines or narrow lines) in forming the optical waveguide core pattern and makes it possible to form fine patterns having a small fine width and a small line space. Further, use thereof makes it possible to provide a process having an excellent productivity in which optical waveguides having a large area can be produced in one lot.

In the optical waveguide 1, a hard substrate such as a silicone substrate, a glass substrate, a glass epoxy substrate including FR-4 and the like can be used as the substrate. The optical waveguide 1 may be a flexible optical waveguide prepared by using the substrate film described above having a flexibility and a toughness.

When the substrate film having a flexibility and a toughness is used as the substrate, the above substrate can be provided with a function of a protective film for the optical waveguide 1 in combination. That is, a flexibility and a toughness of a protective film 5 (substrate) can be imparted to the optical waveguide 1, and the optical waveguide 1 is not susceptible to stain and scratches, so that an easiness in handling is enhanced.

Further, from the viewpoint that a flexibility and a toughness are imparted, as described above, to the optical waveguide 1 to make the optical waveguide free of stain and scratches, the protective film 5 may be disposed at an outside of the upper cladding layer 3 as shown in (b) of FIG. 1, or the protective film 5 may be disposed at both outsides of the lower cladding layer 4 and the upper cladding layer 3 as shown in (c) of FIG. 1.

On the other hand, if the optical waveguide 1 is provided sufficiently with a flexibility and a toughness, the protective film 5 may not be disposed a as shown in (d) of FIG. 1.

A thickness of the lower cladding layer 4 shall not specifically be restricted, and it is preferably 2 to 200 µm. If it is 2 µm or more, a propagated light is readily shut in an inside of the core, and if it is 200 µm or less, a whole thickness of the optical waveguide 1 is not too large. A thickness of the lower cladding layer 4 is a value obtained by measuring from a boundary between the core part 2 and the lower cladding layer 4 to a lower surface of the lower cladding layer 4.

A thickness of the resin film for forming a lower cladding layer shall not specifically be restricted, and the thickness is controlled so that a thickness of the lower cladding layer 4 after cured falls in the range described above.

A height of the core part 2 shall not specifically be restricted, and it is preferably 10 to 500 µm. If a height of the core part is 10 µm or more, the positioning tolerance in bonding with a light source such as LED after forming the optical waveguide is not reduced, and if it is 500 µm or less, the bonding efficiency in bonding with light receiving and emitting devices or an optical fiber after forming the optical waveguide is not reduced.

A thickness of the upper cladding layer 3 shall not specifically be restricted as long as it falls in a range in which the core part 2 can be buried, and it is preferably 12 to 700 µm in terms of a thickness after cured. A thickness of the upper cladding layer 3 may be the same as or different from a thickness of the lower cladding layer 4 which is formed first, and it is preferably larger than a thickness of the lower cladding layer 4 from the viewpoint that the core part 2 is buried therein. A thickness of the upper cladding layer 3 is a value obtained by measuring a boundary between the core part 2 and the lower cladding layer 4 to an upper surface of the upper cladding layer 3.

In the optical waveguide of the present invention, an optical propagation loss in 460 nm is preferably 1.0 dB/cm or less. If it is 1.0 dB/cm or less, a loss of light is reduced, and an intensity of a transmission signal is sufficiently high.

An application example in which the photosensitive resin film of the present invention is used as the resin film for forming an optical waveguide in the most suited application shall be explained below.

The resin film for forming an optical waveguide can be produced as well by the same process as in the photosensitive resin film described above.

A substrate used in a production step of the resin film for forming a core part shall not specifically be restricted as long as an actinic ray for exposure which is used for forming core patterns described later transmits therethrough, and it includes, for example, polyesters such as polyethylene terephthalate, polybutylene terephthalate, polyethylene naphthalate and the like; polyolefins such as polyethylene, polypropylene and the like; polycarbonate, polyphenylene ether, polyallylate and the like.

Among them, polyesters such as polyethylene terephthalate, polybutylene terephthalate and the like and polyolefins such as polypropylene and the like are preferred from the viewpoints of a transmission factor of an actinic ray for exposure, a flexibility and a toughness.

Further, a substrate film of a high transparent type is more preferably used from the viewpoint of enhancing a transmission factor of an actinic ray for exposure and reducing roughening of a side wall in a core pattern. The above substrate film of a high transparent type includes COSMOSHINE A1517 and COSMOSHINE A4100 manufactured by Toyobo Co., Ltd. The film subjected to mold release treatment with a silicone base compound, a fluorine-containing compound and the like may be used, if necessary, from the viewpoint of enhancing an improvement in a peeling property from the resin layer.

A thickness of the substrate film in the resin film for forming a core part is preferably 5 to 50 μm. If it is 5 μm or more, a strength thereof as a support is sufficiently high, and if it is 50 μm or less, a gap between a photomask and a resin composition layer for forming a core part in forming core patterns is not increased, so that the pattern-forming property is good. From the viewpoints described above, a thickness of the substrate film is more preferably 10 to 40 μm, further preferably 15 to 30 μm.

The resin film for forming an optical waveguide produced by coating the resin varnish for forming an optical waveguide or the resin composition for forming an optical waveguide on the substrate film may assume a three layer structure in which the protective film described above is stuck, if necessary, on the resin layer and which comprises the substrate film, the resin layer comprising the photosensitive resin composition or the photosensitive resin cured matter and the protective film.

The resin film for forming an optical waveguide thus obtained can readily be stored by rolling in a roll form. Or, the film of a roll form can be cut to a suited size and stored as well in a sheet form.

A production process for forming an optical waveguide by using the resin varnish for forming an optical waveguide and/or the resin film for forming an optical waveguide shall be explained below.

A process for producing the optical waveguide of the present invention shall not specifically be restricted, and it includes a process for producing the optical waveguide by a spin coating method using the resin varnish for forming a core part and the resin varnish for forming a cladding layer and a process for producing the optical waveguide by a lamination method using the resin film for forming a core part and the resin film for forming a cladding layer. Further, the optical waveguide can be produced as well by combining the above processes. Among them, the process for forming the optical waveguide by a lamination method using the resin film for forming an optical waveguide is preferred from the viewpoint that a production process for an optical waveguide which is excellent in a productivity can be provided.

A production process for forming an optical waveguide by using the resin film for forming an optical waveguide in the lower cladding layer, the core part and the upper cladding layer shall be explained below.

First, the resin film for forming a lower cladding layer is laminated on the substrate to form the lower cladding layer in the first step.

The lamination method in the first step includes a method for laminating the resin film by pressing while heating by means of a roll laminator or a flat plate type laminator, and from the viewpoints of an adhesive property and a followability, the resin film for forming a lower cladding layer is preferably laminated under reduced pressure by means of the flat plate type laminator.

In the present invention, the flat plate type laminator means a laminator in which a laminated material is interposed between a pair of flat plates and in which pressure is applied onto the flat plates to thereby press the laminated material, and a vacuum pressing type laminator can suitably be used.

A heating temperature in the above step is preferably 40 to 130° C., and a pressing pressure is preferably 0.1 to 1.0 MPa, but the above conditions shall not specifically be restricted. When the protective film is present on the resin film for forming a lower cladding layer, the resin film is laminated after removing the protective film.

The resin film for forming a lower cladding layer may be tentatively stuck in advance on the substrate by means of the roll laminator before laminated by means of the vacuum pressing type laminator. In this connection, the resin film is tentatively stuck preferably while pressing from the viewpoint of enhancing an adhesive property and a followability. In pressing, it may be carried out while heating by means of a laminator having a heat roll.

The laminating temperature is preferably 20 to 130° C. If it is 20° C. or higher, an adhesive property between the resin film for forming a lower cladding layer and the substrate is enhanced. If it is 130° C. or lower, the resin layer is not too fluid in roll lamination, and the required film thickness is obtained. From the viewpoints described above, the laminating temperature is more preferably 40 to 100° C. The pressure is preferably 0.2 to 0.9 MPa, and the laminating speed is preferably 0.1 to 3 m/minute, but the above conditions shall not specifically be restricted.

Subsequently, the resin film for forming a lower cladding layer laminated on the substrate is cured by light and/or heat, and the substrate film of the resin film for forming a lower cladding layer is removed to form a lower cladding layer.

An irradiation amount of an actinic ray in forming the lower cladding layer is preferably 0.1 to 5 $J/cm^2$, and the heating temperature is preferably 50 to 200° C., but the above conditions shall not specifically be restricted.

Next, the resin film for forming a core part is laminated in the second step by the same method as in the first step. In this regard, the resin film for forming a core part is designed so that it has a higher refractive index than that of the resin film for forming a lower cladding layer, and it comprises preferably a photosensitive resin composition which can form a core pattern by an actinic ray.

Next, the core part is exposed in the third step to form a core pattern (core part 2) for the optical waveguide. To be specific, an actinic ray is imagewise irradiated through a negative or positive mask pattern called an art work. Also, an actinic ray may be imagewise irradiated using a laser direct drawing without passing through a photomask.

A light source of an actinic ray includes, for example, publicly known light sources which effectively radiate a UV ray, such as a carbon arc lamp, a mercury vapor arc lamp, a ultrahigh pressure mercury lamp, a high pressure mercury lamp, a xenon lamp and the like. Further, in addition thereto, it includes light sources which effectively radiate a visible light, such as a photographic flood bulb, a sun lamp and the like.

In this regard, an irradiation amount of an actinic ray is preferably 0.01 to 10 $J/cm^2$. If it is 0.01 $J/cm^2$ or more, the curing reaction sufficiently proceeds, and the core part 2 is not lost by a developing step described later. If it is 10 $J/cm^2$ or less, the core part 2 is prevented from increasing in a size by excess exposure, and fine patterns can suitably be formed. From the viewpoints described above, it is more preferably 0.05 to 5 $J/cm^2$, particularly preferably 0.1 to 3 $J/cm^2$.

After-exposure heating may be carried out after exposed from the viewpoint of enhancing a resolution and an adhesive property of the core part. Time elapsing from irradiation of a UV ray to after-exposure heating is preferably 10 minutes or shorter. If it is 10 minutes or shorter, active species produced by irradiation of a UV ray are not deactivated. A temperature of the after-exposure heating is preferably 40 to 160° C., and the time is preferably 30 seconds to 10 minutes.

After exposure, the substrate of the resin film for forming a core part is removed to carry out development by a publicly known method such as spraying, oscillation dipping, brushing, scraping, dipping, paddling and the like using a developer such as an alkaline aqueous solution, an aqueous developer and the like, which corresponds to a composition of the resin film for forming a core part. Two or more kinds of a developing method may be used, if necessary, in combination.

A base of the alkaline aqueous solution described above shall not specifically be restricted and includes, for example, alkali hydroxides such as hydroxides of lithium, sodium, potassium and the like; alkali carbonates such as carbonates and bicarbonates of lithium, sodium, potassium, ammonium and the like; alkali metal phosphates such as potassium phosphate, sodium phosphate and the like; alkali metal pyrophosphates such as sodium pyrophosphate, potassium pyrophosphate and the like; sodium salts such as borax, sodium metasilicate and the like; and organic bases such as tetramethylammonium hydroxide, triethanolamine, ethylenediamine, diethylenetriamine, 2-amino-2-hydroxymethyl-1,3-propanediol, 1,3-diaminopropanol-2-morpholine and the like.

A pH of the alkaline aqueous solution used for the development is preferably 9 to 11, and a temperature thereof is controlled in accordance with a developability of the resin composition layer for forming a core part.

A surfactant, a defoaming agent, a small amount of an organic solvent for accelerating the development and the like may be mixed in the alkaline aqueous solution.

Among them, particularly lithium carbonate, sodium carbonate and potassium carbonate aqueous solutions are preferred since stimulation to human bodies and load exerted on the environment are small.

An organic solvent can be used as well, if necessary, in combination for the alkaline aqueous solution described above. The organic solvent referred above shall not specifically be restricted as long as it is miscible with the alkaline aqueous solution, and it includes, for example, alcohols such as methanol, ethanol, isopropanol, butanol, ethylene glycol, propylene glycol and the like; ketones such as acetone, 4-hydroxy-4-methyl-2-pentanone and the like; and polyhydric alcohol alkyl ethers such as ethylene glycol monomethyl ether, ethylene glycol monoethyl ether, propylene glycol monomethyl ether, propylene glycol monoethyl ether, diethylene glycol monomethyl ether, diethylene glycol monoethyl ether, diethylene glycol monobutyl ether and the like. They can be used alone or in combination of two more kinds thereof.

The core part of the optical waveguide may be washed, if necessary, with a cleaning liquid comprising water and the organic solvent described above as treatment after developing. The organic solvent can be used alone or in combination of two more kinds thereof. A concentration of the organic solvent is preferably 2 to 90% by mass, and a temperature thereof is controlled in accordance with a developability of the resin composition layer for forming a core part.

The core part which is further cured, if necessary, by heating at 60 to 250° C. or exposing at 0.1 to 5 $J/cm^2$ in treatment after developing or washing may be used.

Subsequently, the resin film for forming an upper cladding layer is laminated in the fourth step by the same method as in the first and second steps to form an upper cladding layer. In this regard, the resin film for forming an upper cladding layer is designed so that it has a lower refractive index than that of the resin film for forming a core part. A thickness of the upper cladding layer is preferably larger than a height of the core part.

Next, the resin film for forming an upper cladding layer is cured by light and/or heat by the same method as in the first step to form an upper cladding layer.

When the substrate film of the resin film for forming an upper cladding layer is PET, an irradiation amount of an actinic ray is preferably 0.1 to 5 $J/cm^2$. On the other hand, when the substrate film is polyethylene naphthalate, polyamide, polyimide, polyamideimide, polyetherimide, polyphenylene ether, polyether sulfide, polyethersulfone, polysulfone or the like, they are less liable to allow an actinic ray of a short wavelength such as a UV ray and the like to pass therethrough as compared with PET, and therefore an irradiation amount of an actinic ray is preferably 0.5 to 30 $J/cm^2$. If it is 0.5 $J/cm^2$ or more, the curing reaction sufficiently proceeds, and if it is 30 $J/cm^2$ or less, time for light irradiation is not extended too much. From the viewpoints described above, it is more preferably 3 to 27 $J/cm^2$, particularly preferably 5 to 25 $J/cm^2$.

In order to cure more the resin film, a both side exposing device in which both sides can be irradiated with an actinic ray at the same time can be used.

Also, the resin film may be irradiated with an actinic ray while heating. The heating temperature while and/or after irradiated with an actinic ray is preferably 50 200° C., but the above condition shall not specifically be restricted.

The substrate film is removed, if necessary, after forming the upper cladding layer, whereby the optical waveguide 1 can be prepared.

EXAMPLES

The present invention shall more specifically be explained below with reference to examples, but the present invention shall not be restricted to these examples.

Production Example 1

Preparation of (Meth)Acryl Polymer P-1 Having No Chain-Polymerizable Functional Group Propylene glycol monomethyl ether acetate 150 parts by mass and methyl lactate 30 parts by mass were weighed into a flask equipped with a stirrer, a cooling tube, a gas introducing tube, a dropping funnel and a thermometer, and the mixture was stirred while introducing a nitrogen gas.

The liquid temperature was elevated to 80° C., and dropwise added were N-cyclohexylmaleimide 20 parts by mass, dicyclopentanyl methacrylate 40 parts by mass, 2-ethylhexyl methacrylate 25 parts by mass, methacrylic acid 15 parts by mass and 2,2'-azobis(isobutyronitrile) 3 parts by mass, and then the mixture was continued to be stirred at 80° C. for 6 hours to obtain a (meth)acryl polymer P-1 solution (solid content: 36% by mass).

Measurement of Acid Value:

An acid value of P-1 was measured to result in finding that it was 98 mg KOH/g. The acid value was calculated from an amount of a 0.1 mol/L potassium hydroxide aqueous solution required for neutralizing the P-1 solution. In this case, a point at which phenolphthalein added as an indicator was changed from a solid color to a pink color was set as a neutralization point.

Measurement of Weight Average Molecular Weight:

A weight average molecular weight (reduced to standard polystyrene) of P-1 was measured by means of GPC (trade name: SD-8022/DP-8020/RI-8020, manufactured by Tosoh Corp.) to result in finding that it was 27,000. Trade name Gelpack GL-A150-S/GL-A160-S, manufactured by Hitachi Chemical Co., Ltd. was used as the column.

Production Example 2

Preparation of (Meth)Acryl Polymer P-2 Having a Methacryl Group

The P-1 solution (solid content: 36% by mass) described above 168 parts by mass (solid content: 60 parts by mass), dibutyltin dilaurate 0.03 part by mass and p-methoxyphenol 0.1 part by mass were weighed into a flask equipped with a stirrer, a cooling tube, a gas introducing tube, a dropping funnel and a thermometer, and the mixture was stirred while introducing air.

The liquid temperature was elevated to 60° C., and then 2-methacryloyloxyethyl isocyanate 7 parts by mass was dropwise added in 30 minutes. Then, the mixture was continued to be stirred at 60° C. for 4 hours to obtain a solution (solid content: 40% by mass) of a (meth)acryl polymer P-2 having a chain-polymerizable functional group. P-2 comprises A-1, A-2 and A-3 as repetitive units.

An acid value and a weight average molecular weight of P-2 were measured by the same methods as in Production Example 1 to result in finding that they were 53 mg KOH/g and 27,000 respectively.

Production Example 3

Preparation of (Meth)Acryl Polymer P-3 Having No Carboxyl Group

Propylene glycol monomethyl ether acetate 120 parts by mass was weighed into a flask equipped with a stirrer, a cooling tube, a gas introducing tube, a dropping funnel and a thermometer, and the mixture was stirred while introducing a nitrogen gas.

The liquid temperature was elevated to 90° C., and dropwise added in 3 hours was a mixture of N-cyclohexylmaleimide 18 parts by mass, benzyl methacrylate 61 parts by mass, 2-hydroxyethyl methacrylate 55 parts by mass, 2,2'-azobis (isobutyronitrile) 2 parts by mass and propylene glycol monomethyl ether acetate 80 parts by mass. Then, the mixture was stirred at 90° C. for 3 hours and continued to be further stirred at 120° C. for 1 hour, and it was cooled down to room temperature.

Subsequently, dibutyltin dilaurate 0.03 part by mass and p-methoxyphenol 0.1 part by mass were weighed thereinto and stirred while introducing air. The liquid temperature was elevated to 60° C., and then 2-methacryloyloxyethyl isocyanate 7 parts by mass was dropwise added thereto in 30 minutes. Thereafter, the mixture was continued to be stirred at 60° C. for 4 hours to obtain a solution (solid content: 40% by mass) of a (meth)acryl polymer P-3 having a chain-polymerizable functional group. P-3 comprises A-1 and A-2 as repetitive units but does not comprise A-3 and A-4.

An acid value and a weight average molecular weight of P-3 were measured by the same method as in Production Example 1 to result in finding that they were 0.1 mg KOH/g and 23,000 respectively.

Example 1

Preparation of Resin Varnish CO-1 for Forming a Core Part

Weighed into a wide mouth plastic bottle were the P-2 solution (solid content: 40% by mass) described above 150 parts by mass (solid content: 60 parts by mass) as the component (A), ethoxylated bisphenol A diacrylate (trade name: A-BPE-6, manufactured by Shin-Nakamura Chemical Co., Ltd.) 20 parts by mass and p-cumylphenoxyethyl acrylate (trade name: A-CMP-1E, manufactured by Shin-Nakamura Chemical Co., Ltd.) 20 parts by mass as the component (B) and a mixture (Irgacure 754, manufactured by Ciba Specialty Chemicals K.K.) 2 parts by mass of 2-[2-oxo-2-phenylacetoxyethoxy]ethyl oxyphenylacetate and 2-(2-hydroxyethoxy)ethyl oxyphenylacetate, and the mixture was stirred for 6 hours on the conditions of a temperature of 25° C. and a revolution of 400 min$^{-1}$ by means of a stirrer to prepare a resin varnish for forming a core part.

Then, the varnish was filtrated under pressure through a polyflon filter having a pore diameter of 2 μm (trade name: PF020, manufactured by Advantec Toyo Kaisha, Ltd.) and a membrane filter having a pore diameter of 0.5 μm (trade name: J050A, manufactured by Advantec Toyo Kaisha, Ltd.) on the conditions of a temperature of 25° C. and a pressure of 0.4 MPa. Subsequently, the varnish was defoamed under reduced pressure for 15 minutes on the condition of a vacuum degree of 50 mm Hg (about 6.7 kPa) by means of a vacuum pump and a bell jar to obtain a resin varnish CO-1 for forming a core part.

Preparation of Resin Film COF-1 for Forming a Core Part:

The resin varnish CO-1 for forming a core part described above was applied on a non-treated surface of a PET film (trade name: A1517, thickness: 16 μm, manufactured by Toyobo Co., Ltd.) by means of an applicator (trade name: Multicoater TM-MC, manufactured by Hirano Tecseed Co., Ltd.) and dried at 100° C. for 20 minutes. Then, a mold release PET film (trade name: A31, thickness: 25 μm, manufactured by Teijin DuPont Films Japan Ltd.) was stuck thereon as a protective film to obtain a resin film COF-1 for forming a core part. In this case, a thickness of the resin layer could optionally be controlled by controlling a gap of the applicator, and it was controlled in the present example so that the film thickness after cured was 50 µm. Also, a thickness of the film for measuring a transmission intensity was controlled so that the film thickness was 100 µm.

Preparation of Resin Varnish CL-1 for Forming a Cladding Layer:

As shown in Table 1, weighed into a wide mouth plastic bottle were the P-2 solution (solid content: 40% by mass) described above 150 parts by mass (solid content: 60 parts by mass) as the component (A), ethoxylated cyclohexanedimethanol diacrylate (trade name: A-CHD-4E, manufactured by Shin-Nakamura Chemical Co., Ltd.) 20 parts by mass and ethoxylated isocyanuric acid triacrylate (trade name: A-9300S, manufactured by Shin-Nakamura Chemical Co., Ltd.) 20 parts by mass as the component (B) and bis(2,4,6-trimethylbenzoyl)phenylphosphine oxide (trade name: Irgacure 819, manufactured by Ciba Specialty Chemicals K.K.) 1 part by mass and 1-[4-(2-hydroxyethoxy)phenyl]-2-hydroxy-2-methyl-1-propane-1-one (trade name: Irgacure 2959, manufactured by Ciba Specialty Chemicals K.K.) 1 part by mass as the polymerization initiator (C'), and the mixture was stirred for 6 hours on the conditions of a temperature of 25° C. and a revolution of 400 min$^{-1}$ by means of a stirrer to prepare a resin varnish for forming a cladding part.

Then, the varnish was filtrated under pressure through a polyflon filter having a pore diameter of 2 µm (trade name: PF020, manufactured by Advantec Toyo Kaisha, Ltd.) and a membrane filter having a pore diameter of 0.5 µm (trade name: J050A, manufactured by Advantec Toyo Kaisha, Ltd.) on the conditions of a temperature of 25° C. and a pressure of 0.4 MPa. Subsequently, the varnish was defoamed under reduced pressure for 15 minutes on the condition of a vacuum degree of 50 mm Hg by means of a vacuum pump and a bell jar to obtain a resin varnish CL-1 for forming a cladding part.

TABLE 1

| | Blend component | | Blend amount (parts by mass) |
|---|---|---|---|
| Component (A) | Vinyl polymer | P-2*[1] (solid content: 40 parts by mass) | 150 (60)*[6] |
| Component (B) | Polymerizable compound | A-CHD-4E*[2] A-9300S*[3] | 20 20 |
| Component (C') | Polymerization initiator | Irgacure 819*[4] Irgacure 2959*[5] | 1 1 |

*[1](Meth)acryl polymer solution produced in Production Example 2
*[2]Ethoxylated cyclohexanedimethanol diacrylate (manufactured by Shin-Nakamura Chemical Co., Ltd.)
*[3]Ethoxylated isocyanuric acid triacrylate (manufactured by Shin-Nakamura Chemical Co., Ltd.)
*[4]Bis(2,4,6-trimethylbenzoyl)phenylphosphine oxide (manufactured by Ciba Specialty Chemicals K.K.)
*[5]1-[4-(2-hydroxyethoxy)phenyl]-2-hydroxy-2-methyl-1-propane-1-one (manufactured by Ciba Specialty Chemicals K.K.)
*[6]Number in a parenthesis shows a blending amount reduced to a solid content Preparation of Resin Film CLF-1 for Forming a Lower Cladding Layer:

The resin varnish CL-1 for forming a cladding layer described above was applied on a non-treated surface of a PET film (trade name: A4100, thickness: 50 µm, manufactured by Toyobo Co., Ltd.) and dried by the same method as in the resin film for forming a core layer to obtain a resin film CLF-1 for forming a cladding layer. In this case, a thickness of the resin layer could optionally be controlled by controlling a gap of the applicator, and it was controlled in the present example so that the film thickness after cured was 25 µm.

Preparation of Resin Film CLF-2 for Forming an Upper Cladding Layer:

The resin varnish CL-1 for forming a cladding layer described above was applied on a non-treated surface of a PET film (trade name: A1517, thickness: 16 µm, manufactured by Toyobo Co., Ltd.) and dried by the same method as in the resin film for forming a core layer to obtain a resin film CLF-2 for forming a cladding layer. In this case, a thickness of the resin layer could optionally be controlled by controlling a gap of the applicator, and it was controlled in the present example so that the film thickness after cured was 80 µm.

Preparation of Cured Film for Measuring an Intensity of a Transmitted Light:

Two sheets of the film COF-1 for measuring an intensity of a transmitted light from which the protective film (A31) was removed were stuck together and laminated on the conditions of a pressure of 0.5 MPa, a temperature of 50° C. and a pressing time of 30 seconds by means of a vacuum press laminator.

Then, the film was cut into a strip form having a length of 10 cm and a width of 1 cm, and both sides thereof were irradiated with a UV ray (wavelength: 365 nm) at an intensity of 2 J/cm$^2$ and cured. Thereafter, the substrate film (A1517) was removed therefrom, and then the film was subjected to heat treatment at 120° C. for 1 hour to thereby obtain a cured film for measuring an intensity of a transmitted light.

Preparation of Optical Waveguide ((d) of FIG. 1):

The resin film CLF-1 for forming a lower cladding layer was irradiated with a UV ray (wavelength: 365 nm) at an intensity of 2 J/cm$^2$ by means of a UV ray exposing equipment (trade name: MAP-1200-L, manufactured by Dainippon Screen Mfg. Co., Ltd.), and then the substrate film (A1517) was removed. The resin film COF-1 for forming a core part from which the protective film (A31) was removed was laminated on the above lower cladding film cured on the conditions of a pressure of 0.4 MPa, a temperature of 80° C. and a speed of 0.4 m/minute by means of a roll laminator (trade name: HLM-1500, manufactured by Hitachi Chemical Techno Plant Co., Ltd.).

Then, the film was irradiated with a UV ray (wavelength: 365 nm) at an intensity of 1.5 J/cm$^2$ via a negative type photomask having a width of 50 µm by means of the UV ray exposing equipment described above, and it was further exposed at 80° C. for 5 minutes and then heated. The substrate film (A1517) was removed therefrom, and the core part 2 was developed by using a developer (1 mass % sodium carbonate aqueous solution). Thereafter, the film was washed with a 20% isopropyl alcohol aqueous solution and then refined water and dried by heating at 100° C. for 1 hour.

Next, the resin film CLF-2 for forming an upper cladding layer from which the protective film (A31) was removed was laminated on the core part 2 and the cladding layer 4 on the conditions of a pressure of 0.5 MPa, a temperature of 50° C. and a pressing time of 30 seconds by means of the vacuum press laminator described above.

The resin film was irradiated with a UV ray (wavelength: 365 nm) at an intensity of 2 J/cm$^2$, and the substrate film (A1517) was removed. Then, the film was subjected to heat treatment at 120° C. for 1 hour to thereby form an upper cladding layer 3, and the optical waveguide 1 shown in FIG.

1 (d) was obtained. Thereafter, an optical waveguide having a waveguide length of 10 cm was cut out by means of a dicing saw (trade name: DAD-341, manufactured by DISCO Corporation).

Measurement of Transmission Intensity of White LED Light:

A white LED light (current output: 15 mA) was input from an end face of the sample for measuring a transmission intensity, and the sample was covered with a black cloth so that light did not leak from the input part. The transmitted light was output from the other end face, and the output light was detected by means of a spectroscope (trade name: emission measuring device MCPD-3000, manufactured by Otsuka Electronics Co., Ltd.). The transmission intensity ratio was calculated from a transmission intensity peak observed in the vicinity of 560 nm and a transmission intensity peak observed in the vicinity of 450 nm to find that it was 1:1.77.

Measurement of Light Propagation Loss:

A light propagation loss of the optical waveguide cut out was measured using VCSEL (trade name: FLS-300-01-VCL, manufactured by EXFO Corporation) having a wavelength of 850 nm as a central wavelength which was used for a light source, a light-sensitive sensor (trade name: Q82214, manufactured by Advantest Corporation), an input fiber (GI-50/125 multimode fiber, NA=0.20) and an output fiber (SI-114/125, NA=0.22) to result in finding that it was 0.12 dB/cm.

Next, a spectrum was measured between 300 to 1200 nm using white LED (trade name: AQ-6303B, manufactured by Yokogawa Electric Corporation) for a light source and a loss wavelength spectrum measuring device (trade name: AQ-6315A, manufactured by Yokogawa Electric Corporation) for a light-sensitive sensor.

The propagation loss value in the VCSEL light source (850 nm) described above was used to correct the spectrum, and a loss value in 460 nm was read from the corrected spectrum thus obtained and set as a light propagation loss in the white LED. A propagation loss amount obtained from the corrected spectrum was 0.77 dB/cm.

Examples 2 to 4 and Comparative Examples 1 to 5

Resin varnishes CO-2 to 9 for forming a core part were prepared according to blend ratios shown in Table 2. Resin films COF-2 to 9 for forming a core part were prepared by the same method as in Example 1 to prepare an optical waveguide 1. The combinations of the resin film for forming a core part and the resin film for forming a cladding layer which were used for preparing the optical waveguide 1 are shown in Table 3.

Further, shown in Tables 4 and 5 are measured results of a transmitted light intensity of white LED in the core layer-cured films obtained and measured results of a propagation loss of the optical waveguide 1 and appearance observation of the waveguide pattern forms.

TABLE 2

| | | Blend Component | CO-1 | CO-2 | CO-3 | CO-4 | CO-5 | CO-6 | CO-7 | CO-8 | CO-9 |
|---|---|---|---|---|---|---|---|---|---|---|---|
| Component (A) | Vinyl polymer | P-1*[7] (solid content: 36% by mass) | — | — | — | — | — | 168 (60) | — | — | — |
| | | P-2*[8] (solid content: 40% by mass) | 150 (60) | — | 150 (60) | 150 (60) | 150 (60) | — | 150 (60) | 150 (60) | 150 (60) |
| | | P-3*[9] (solid content: 40% by mass) | — | 150 (60) | — | — | — | — | — | — | — |
| Component (B) | Polymerizable compound | A-BPE-6*[10] | 20 | 20 | 20 | 20 | 20 | 20 | 20 | 20 | 20 |
| | | A-CMP-1E*[11] | 20 | 20 | 20 | 20 | 20 | 20 | 20 | 20 | |
| Component (C) | Polymerization initiator | Irgacure 754*[12] | 2 | 2 | — | 0.5 | 5 | 2 | — | 0.3 | 10 |
| | | E-ONE*[13] | — | — | 2 | — | — | — | — | — | — |
| Component (C') | Polymerization initiator | Irgacure 2959*[14] | — | — | — | — | — | — | 2 | — | — |
| Film for forming core part | | | COF-1 | COF-2 | COF-3 | COF-4 | COF-5 | COF-6 | COF-7 | COF-8 | COF-9 |

*[7](Meth)acryl polymer solution produced in Production Example 1
*[8](Meth)acryl polymer solution produced in Production Example 2
*[9](Meth)acryl polymer solution produced in Production Example 3
*[10]Ethoxylated bisphenol A diacrylate (manufactured by Shin-Nakamura Chemical Co., Ltd.)
*[11]p-Cumylphenoxyethyl acrylate (manufactured by Shin-Nakamura Chemical Co., Ltd.)
*[12]Mixture (manufactured by Ciba Specialty Chemicals K.K.) of 2-[2-oxo-2-phenylacetoxyethoxy]ethyl oxyphenylacetate and 2-(2-hydroxyethoxy)ethyl oxyphenylacetate
*[13]Oligo{2-hyroxy-2-methyl-1-[4-(1-methylvinyl)phenyl]}propanone (manufactured by Nihon SiberHegner K.K.)
*[14]1-[4-(2-hydroxyethoxy)phenyl]-2-hydroxy-2-methyl-1-propane-1-one (manufactured by Ciba Specialty Chemicals K.K.)

TABLE 3

| | Example | | | | Comparative Example | | | | |
|---|---|---|---|---|---|---|---|---|---|
| | 1 | 2 | 3 | 4 | 1 | 2 | 3 | 4 | 5 |
| Resin film for forming upper cladding layer | CLF-2 | CLF-2 | CLF-2 | CLF-2 | CLF-2 | CLF-2 | CLF-2 | CLF-2 | CLF-2 |
| Resin film for forming core part | COF-1 | COF-3 | COF-4 | COF-5 | COF-2 | COF-6 | COF-7 | COF-8 | COF-9 |
| Resin film for forming lower cladding layer | CLF-1 | CLF-1 | CLF-1 | CLF-1 | CLF-1 | CLF-1 | CLF-1 | CLF-1 | CLF-1 |

TABLE 4

| | Example | | | |
|---|---|---|---|---|
| | 1 | 2 | 3 | 4 |
| Developability of core part to 1 mass % sodium carbonate aqueous solution | Good | Good | Good | Good |
| Appearance of core film | Transparent | Transparent | Transparent | Transparent |
| Light propagation loss (460 nm) | 0.77 | 0.7 | 0.5 | 0.9 |
| Transmission intensity ratio of white LED light in core material (ratio of intensity in vicinity of 560 nm: intensity in vicinity of 450 nm) | 1:1.5 | 1:1.7 | 1:1.9 | 1:1 |

TABLE 5

| | Comparative Example | | | | |
|---|---|---|---|---|---|
| | 1 | 2 | 3 | 4 | 5 |
| Developability of core part to 1 mass % sodium carbonate aqueous solution | Undevelopable | Good | Good | Pattern dissolved | Good |
| Appearance of core film | Transparent | Cloudy | Transparent | Transparent | Transparent |
| Light propagation loss (460 nm) | Unmeasurable | Unmeasurable | 1.84 | Unmeasurable | 2 |
| Transmission intensity ratio of white LED light in core material (ratio of intensity in vicinity of 560 nm: intensity in vicinity of 450 nm) | 1:1.5 | 1:1.7 | 1:1.9 | 1:1 | 1:0.7 |

As shown Tables 4 and 5, a developing process in which sodium carbonate is used can be applied to the resin composition of the present invention and the optical waveguide prepared by using the same, and the optical waveguide is excellent in light propagation characteristics. A transmitted light is close to light emitted from the light source, and it is obvious that the optical waveguide is suited to uses for illumination.

On the other hand, in Comparative Example 1 in which the vinyl polymer having no carboxyl group was used, the film could not be developed by using sodium carbonate. In Comparative Example 2 in which the vinyl polymer having no chain-polymerizable functional group was used, the core material was opaque.

Also, in Comparative Example 4 in which a blending amount of the photoinitiator was small, optical curing did not sufficiently proceed, and development could not be carried out.

Further, in Comparative Example 5 in which a blending amount of the photoinitiator was large and a case (Comparative Example 3) in which Irgacure 2959 was used as the photoinitiator, the propagation loss was large due to coloration originating in the photoinitiator, and the transmitted light was yellower than original light emitted from the light source. Accordingly, it was unsuited to uses for illumination.

As shown above, the present invention makes it possible to provide a photosensitive resin composition having a good propagation loss in a visible light wavelength region, a photosensitive resin cured matter, a photosensitive resin film, a photosensitive resin film cured matter and an optical waveguide obtained by using the same.

INDUSTRIAL APPLICABILITY

The photosensitive resin composition of the present invention is soluble in an alkaline aqueous solution and therefore can be developed by alkali in forming a core pattern, and the work environment can be improved. In addition thereto, the environmental load can be reduced. Also, it has a good propagation loss in a visible light region and therefore is most suited to uses of an optical waveguide and the like. Further, the photosensitive resin film of the present invention makes it possible to produce an optical waveguide at a high productivity.

What is claimed is:

1. A photosensitive resin composition comprising (A) a vinyl polymer having at least one chain-polymerizable functional group and having at least one carboxyl group in a molecule, (B) a polymerizable compound and (C) a polymerization initiator, wherein the component (C) is at least one selected from the group consisting of 2-[2-oxo-2-phenylacetoxyethoxy]ethyl oxyphenylacetate and 2-(2-hydroxyethoxy)ethyl oxyphenylacetate; and a content of the component (C) is 0.5 to 5.0 parts by mass based on total 100 parts by mass of the component (A) and the component (B).

2. The photosensitive resin composition as described in claim 1, wherein the component (C) contains 2-[2-oxo-2-phenylacetoxyethoxy]ethyl oxyphenylacetate and 2-(2-hydroxyethoxy)ethyl oxyphenylacetate.

3. The photosensitive resin composition as described in claim 1, wherein a blending amount of the component (A) is 10 to 85% by mass based on the whole amount of the component (A) and the component (B).

4. The photosensitive resin composition as described in claim 1, wherein the component (A) comprises at least one of a repetitive unit (A-1) represented by the following Formula (1) and a repetitive unit (A-2) represented by the following Formula (2) and at least one of a repetitive unit (A-3) represented by the following Formula (3) and a repetitive unit (A-4) represented by the following Formula (4):

[Formula 1]

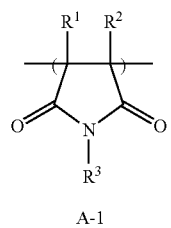

A-1

(wherein $R^1$ to $R^3$ each are independently a hydrogen atom or a monovalent organic group having 1 to 20 carbon atoms);

[Formula 2]

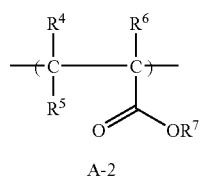

A-2

(wherein $R^4$ to $R^6$ each are independently a hydrogen atom or a monovalent organic group having 1 to 20 carbon atoms; and $R^7$ is a monovalent organic group having 1 to 20 carbon atoms);

[Formula 3]

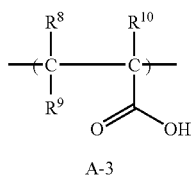

A-3

(wherein $R^8$ to $R^{10}$ each are independently a hydrogen atom or a monovalent organic group having 1 to 20 carbon atoms); and

[Formula 4]

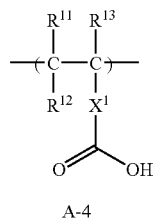

A-4

(wherein $R^{11}$ to $R^{13}$ each are independently a hydrogen atom or a monovalent organic group having 1 to 20 carbon atoms; and $X^1$ is a divalent organic group having 1 to 20 carbon atoms).

5. The photosensitive resin composition as described in claim 1, wherein the component (A) is soluble in an aqueous solution of carbonate of alkali metal or alkali earth metal.

6. The photosensitive resin composition as described in claim 1, wherein the component (B) is a compound containing at least one chain-polymerizable functional group in a molecule.

7. The photosensitive resin composition as described in claim 6, wherein the chain-polymerizable functional group contained in the component (B) is an ethylenically unsaturated group.

8. The photosensitive resin composition as described in claim 1, wherein the component (B) is at least one selected from the group consisting of compounds represented by the following Formulas (5) to (8):

[Formula 5]

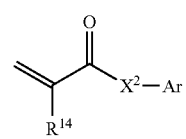

(wherein $R^{14}$ is a hydrogen atom or methyl; $X^2$ is a divalent group represented by O (oxygen atom), S (sulfur atom), $OCH_2$, $SCH_2$, $O(CH_2CH_2O)_a$, $O[CH_2CH(CH_3)O]_b$ or $OCH_2CH(OH)CH_2O$ (a and b each are independently an integer of 1 to 20); Ar is any of monovalent organic groups represented by the following formulas; and it is bonded to X2 at a part of a * mark:

[Formula 6]

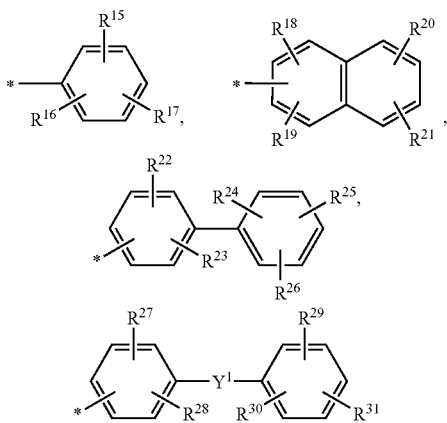

($R^{15}$ to $R^{31}$ each are independently any of a hydrogen atom, a fluorine atom, a monovalent organic group having 1 to 20 carbon atoms and a monovalent fluorine-containing organic group having 1 to 20 carbon atoms; and $Y^1$ is any of divalent groups represented by the following formulas:

[Formula 7]

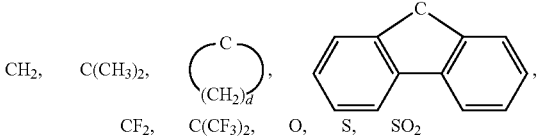

(d represents an integer of 2 to 10)));

[Formula 8]

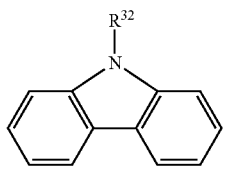

(6)

[Formula 11]

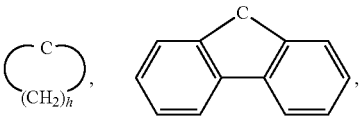

(h represents an integer of 2 to 10)));

[Formula 12]

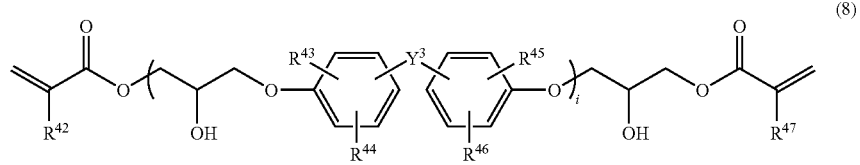

(8)

(wherein $R^{32}$ is any of monovalent organic groups represented by the following formulas, and it is bonded to N at a part of a * mark:

[Formula 9]

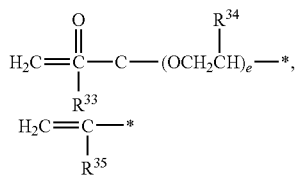

wherein $R^{33}$ to $R^{35}$ each are independently a hydrogen atom or methyl; and e is an integer of 1 to 10)));

[Formula 10]

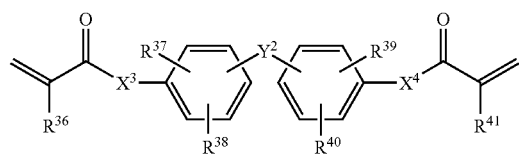

(7)

(wherein $R^{36}$ and $R^{41}$ each are independently a hydrogen atom or methyl; $R^{37}$ to $R^{40}$ each are independently any of a hydrogen atom, a fluorine atom, a monovalent organic group having 1 to 20 carbon atoms and a monovalent fluorine-containing organic group having 1 to 20 carbon atoms; $X^3$ and $X^4$ each are independently a divalent group represented by O, S, $O(CH_2CH_2O)_f$ or $O[CH_2CH(CH_3)O]_g$ (f and g each are independently an integer of 1 to 20); and $Y^2$ is any of divalent groups represented by the following formulas:

(wherein $R^{42}$ and $R^{47}$ each are independently a hydrogen atom or methyl; $R^{43}$ to $R^{46}$ each are independently any of a hydrogen atom, a fluorine atom, a monovalent organic group having 1 to 20 carbon atoms and a monovalent fluorine-containing organic group having 1 to 20 carbon atoms; $Y^3$ is any of divalent groups represented by the following formulas, and i is an integer of 1 to 5:

[Formula 13]

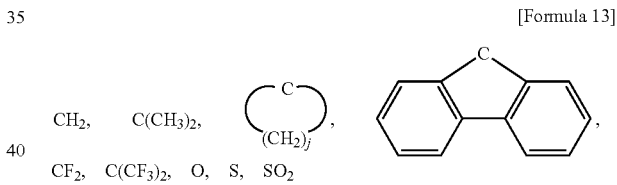

(j is an integer of 2 to 10)).

9. A photosensitive resin cured matter obtained by curing or polymerizing the photosensitive resin composition as described in claim 1.

10. The photosensitive resin cured matter as described in claim 9, wherein a transmission intensity ratio determined from a transmission intensity peak in the vicinity of 560 nm and a transmission intensity peak in the vicinity of 450 nm which are observed in irradiating the cured matter with a white LED light is 1:1 to 1:4.

11. A photosensitive resin film comprising a three layer structure of a base film, a resin layer comprising the photosensitive resin composition as described in claim 1 and a protective film.

12. A photosensitive resin film cured matter comprising a three layer structure of a base film, a resin layer comprising the photosensitive resin composition as described in claim 1 and a protective film.

13. An optical waveguide, wherein at least one of a lower cladding layer, a core part and an upper cladding layer is formed by using the photosensitive resin film as described in claim 11.

14. An optical waveguide, wherein at least the core part is formed by using the photosensitive resin film as described in claim 11.

15. The optical waveguide as described in claim 13, wherein an optical propagation loss in 460 nm is 1.0 dB/cm or less.

16. A photosensitive resin film comprising a three layer structure of a base film, a resin layer comprising the photosensitive resin cured matter as described in claim 9 and a protective film.

17. A photosensitive resin film cured matter comprising a three layer structure of a base film, a resin layer comprising photosensitive resin cured matter as described in claim 9 and a protective film.

18. An optical waveguide, wherein at least one of a lower cladding layer, a core part and an upper cladding layer is formed by using the photosensitive resin film cured matter as described in claim 12.

19. An optical waveguide, wherein at least the core part is formed by using the photosensitive resin film cured matter as described in claim 12.

20. The optical waveguide as described in claim 19, wherein an optical propagation loss in 460 nm is 1.0 dB/cm or less.

21. The photosensitive resin composition as described in claim 4, wherein the component (B) is at least one selected from the group consisting of compounds represented by the following Formulas (5) to (8):

[Formula 5]

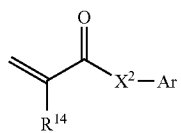

(5)

(wherein $R^{14}$ is a hydrogen atom or methyl; $X^2$ is a divalent group represented by O (oxygen atom), S (sulfur atom), $OCH_2$, $SCH_2$, $O(CH_2CH_2O)_a$, $O[CH_2CH(CH_3)O]_b$ or $OCH_2CH(OH)CH_2O$ (a and b each are independently an integer of 1 to 20); Ar is any of monovalent organic groups represented by the following formulas; and it is bonded to $X^2$ at a part of a * mark:

[Formual 6]

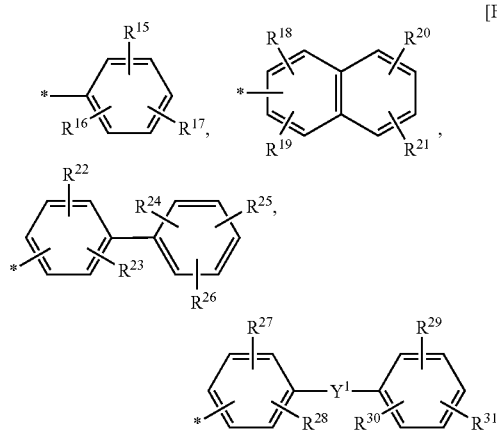

($R^{15}$ to $R^{31}$ each are independently any of a hydrogen atom, a fluorine atom, a monovalent organic group having 1 to 20 carbon atoms and a monovalent fluorine-containing organic group having 1 to 20 carbon atoms; and $Y^1$ is any of divalent groups represented by the following formulas:

[Formula 7]

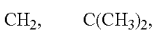 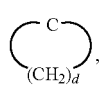

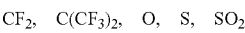 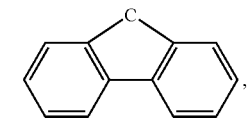

(d represents an integer of 2 to 10)));

[Formula 8]

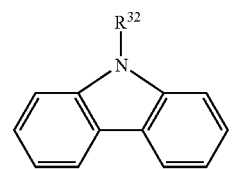

(6)

(wherein $R^{32}$ is any of monovalent organic groups represented by the following formulas, and it is bonded to N at a part of a * mark:

[Formula 9]

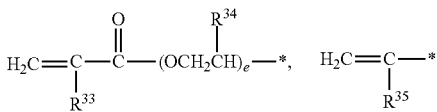

wherein $R^{33}$ to $R^{35}$ each are independently a hydrogen atom or methyl; and e is an integer of 1 to 10)));

[Formula 10]

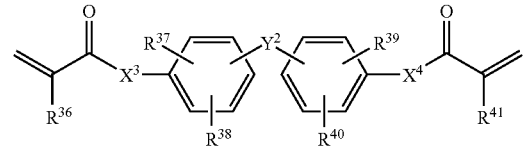

(7)

(wherein $R^{36}$ and $R^{41}$ each are independently a hydrogen atom or methyl; $R^{37}$ to $R^{40}$ each are independently any of a hydrogen atom, a fluorine atom, a monovalent organic group having 1 to 20 carbon atoms and a monovalent fluorine-containing organic group having 1 to 20 carbon atoms; $X^3$ and $X^4$ each are independently a divalent group represented by O, S, $O(CH_2CH_2O)_f$ or $O[CH_2CH(CH_3)O]_g$ (f and g each are independently an integer of 1 to 20); and $Y^2$ is any of divalent groups represented by the following formulas:

[Formula 11]

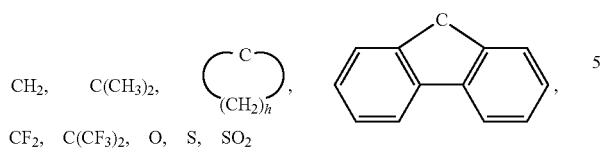

(h represents an integer of 2 to 10)));

[Formula 12]

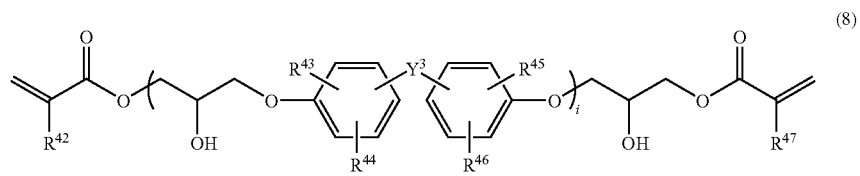 (8)

(wherein $R^{42}$ and $R^{47}$ each are independently a hydrogen atom or methyl; $R^{43}$ to $R^{46}$ each are independently any of a hydrogen atom, a fluorine atom, a monovalent organic group having 1 to 20 carbon atoms and a monovalent fluorine-containing organic group having 1 to 20 carbon atoms; $Y^3$ is any of divalent groups represented by the following formulas, and i is an integer of 1 to 5:

[Formula 13]

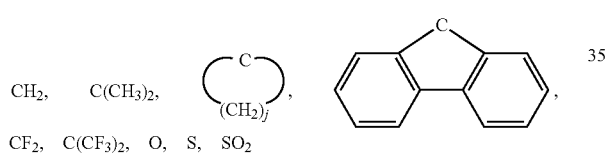

(j is an integer of 2 to 10)).

22. The photosensitive resin composition as described in claim 1, wherein a weight-average molecular weight of the component (A) is 1,000 to 3,000,000.

23. The photosensitive resin composition as described in claim 1, wherein respective molecular skeletons of said vinyl polymer and said polymerizable compound have a constitution that includes no structure having electron transition absorption in which light is absorbed in a range of 420 to 500 nm and no structure in which two or more aromatic rings are bonded directly to each other.

* * * * *